(12) United States Patent
Kishi et al.

(10) Patent No.: US 10,340,850 B2
(45) Date of Patent: *Jul. 2, 2019

(54) CRYSTAL OSCILLATOR DEVICE AND METHOD OF MEASURING CRYSTAL OSCILLATOR CHARACTERISTIC

(71) Applicant: FUJITSU LIMITED, Kawasaki-shi, Kanagawa (JP)

(72) Inventors: Masakazu Kishi, Kawasaki (JP);
Hajime Kubota, Kawasaki (JP);
Masayuki Itoh, Kawasaki (JP);
Yoshinori Mesaki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 116 days.

This patent is subject to a terminal disclaimer.

(21) Appl. No.: 15/602,173

(22) Filed: May 23, 2017

(65) Prior Publication Data
US 2017/0359023 A1    Dec. 14, 2017

(30) Foreign Application Priority Data

Jun. 10, 2016  (JP) .................................. 2016-116463

(51) Int. Cl.
*H03B 1/02* (2006.01)
*H03B 5/04* (2006.01)
(Continued)

(52) U.S. Cl.
CPC .............. *H03B 5/323* (2013.01); *H03B 1/02* (2013.01); *H03B 5/04* (2013.01); *H03B 5/32* (2013.01);
(Continued)

(58) Field of Classification Search
CPC ... H03B 1/02; H03B 5/06; H03B 5/32; H03B 5/36; H03B 5/364; H03B 5/323;
(Continued)

(56) References Cited

U.S. PATENT DOCUMENTS 4,144,747 A * 3/1979 Datwyler, Jr. .......... G01L 1/162
310/338
4,678,905 A   7/1987 Phillips
(Continued)

FOREIGN PATENT DOCUMENTS

JP   1-186003 A   7/1989
JP   3-220806 A   9/1991
(Continued)

OTHER PUBLICATIONS

Rowe, "Check the clock oscillators", 2007, retrieved from http://www.edn.com/Pdf/ViewPdf?contentItemId=4381286 on Dec. 14, 2018 (Year: 2007).*

(Continued)

*Primary Examiner* — Ryan Johnson
(74) *Attorney, Agent, or Firm* — Fujitsu Patent Center

(57) ABSTRACT

A crystal oscillator device is disclosed. The crystal oscillator device includes: a crystal oscillator including a casing, a crystal piece, a pair of excitation electrodes configured to excite a main vibration, and a pair of sub vibration electrodes configured to excite a sub-vibration; and an alarm generator configured to generate an alarm based on a signal whose amplitude is equal to or less than a reference value, the signal being generated in the sub vibration electrodes.

11 Claims, 17 Drawing Sheets

(51) Int. Cl.
  *H03B 5/32* (2006.01)
  *H03B 5/36* (2006.01)
  *H03G 3/20* (2006.01)
  *H03G 3/30* (2006.01)
  *H03L 5/00* (2006.01)

(52) U.S. Cl.
  CPC .............. *H03B 5/364* (2013.01); *H03G 3/20* (2013.01); *H03L 5/00* (2013.01); *H03B 2200/0046* (2013.01); *H03B 2200/0066* (2013.01); *H03G 3/30* (2013.01)

(58) Field of Classification Search
  CPC .... H03B 2200/0034; H03B 2200/0046; H03L 3/00; H03L 5/00; H03H 3/02; G01H 15/00; G01R 29/22
  See application file for complete search history.

(56) References Cited

U.S. PATENT DOCUMENTS

| | | | |
|---|---|---|---|
| 5,572,322 A | 11/1996 | Noda | |
| 5,654,678 A | 8/1997 | Miyazaki | |
| 7,859,355 B2* | 12/2010 | Brennan | H03B 5/06 331/177 V |
| 7,893,784 B2* | 2/2011 | Hirama | H03B 5/30 331/116 M |
| 8,456,243 B2 | 6/2013 | Aleman et al. | |
| 8,564,378 B2 | 10/2013 | Takahashi | |
| 8,928,419 B2 | 3/2015 | Ishii et al. | |
| 9,024,695 B2* | 5/2015 | Kishi | H03B 5/323 331/116 R |
| 9,520,830 B2* | 12/2016 | Sato | H03B 5/36 |
| 2007/0040470 A1* | 2/2007 | Watanabe | G01C 19/5607 310/316.01 |
| 2008/0279250 A1 | 11/2008 | Kamei | |
| 2011/0156823 A1 | 6/2011 | Koyama et al. | |
| 2012/0068776 A1 | 3/2012 | Asamura et al. | |
| 2012/0326794 A1 | 12/2012 | Kammula | |
| 2016/0218671 A1 | 7/2016 | Jun et al. | |
| 2017/0359021 A1 | 12/2017 | Kishi et al. | |
| 2017/0359022 A1 | 12/2017 | Kishi et al. | |
| 2017/0359023 A1 | 12/2017 | Kishi et al. | |
| 2017/0359025 A1 | 12/2017 | Kishi et al. | |
| 2017/0359026 A1 | 12/2017 | Kishi et al. | |
| 2017/0359044 A1 | 12/2017 | Kishi et al. | |
| 2018/0054163 A1 | 2/2018 | Chen et al. | |

FOREIGN PATENT DOCUMENTS

| | | |
|---|---|---|
| JP | 6-177645 A | 6/1994 |
| JP | 8-015122 A | 1/1996 |
| JP | 8-327398 A | 12/1996 |
| JP | 2004-198126 A | 7/2004 |
| JP | 2008-139256 A | 6/2008 |
| JP | 2010-232974 A | 10/2010 |
| JP | 2011-135342 | 7/2011 |
| JP | 2011-135342 A | 7/2011 |
| JP | 2012-070193 A | 4/2012 |
| JP | 2013-106052 | 5/2013 |
| JP | 2013-106052 A | 5/2013 |
| WO | 2012/042889 A | 4/2012 |

OTHER PUBLICATIONS

U.S. Office Action dated Dec. 4, 2018 for copending U.S. Appl. No. 15/498,679, 23 pages.
U.S. Office Action dated Jan. 7, 2019 for copending U.S. Appl. No. 15/602,202, 9 pages.
U.S. Office Action dated Jan. 8, 2019 or copending U.S. Appl. No. 15/602,158, 13 pages.
U.S. Office Action dated Feb. 12, 2019 for copending U.S. Appl. No. 15/581,908, 10 pages.
U.S. Office Action dated Feb. 1, 2019 for copending U.S. Appl. No. 15/581,908, 10 pages.
U.S. Office Action dated Jan. 10, 2019 for copending U.S. Appl. No. 15/581,908, 12 pages.
U.S. Office Action dated Dec. 10, 2018 for copending U.S. Appl. No. 15/581,908, 12 pages.
U.S. Office Action dated Jan. 22, 2019 for copending U.S. Appl. No. 15/585,249, 13 pages.
Rowe, Martin, "Check the clock oscillators", May 1, 2007, retrieved from http://www.edn.com/Pdf/ViewPdf?contentItemId=4381286 on Dec. 14, 2018, 2 pages.
U.S. Office Action dated Apr. 10, 2019 for copending U.S. Appl. No. 15/602,202, 23 pages.
U.S. Office Action dated Apr. 12, 2019 for copending U.S. Appl. No. 15/585,249, 19 pages.
Office Action dated Apr. 22, 2019 for copending U.S. Appl. No. 15/498,679, 13 pages.
Office Action dated Apr. 24, 2019 for copending U.S. Appl. No. 15/602,158, 19 pages.

* cited by examiner

FIG.7A
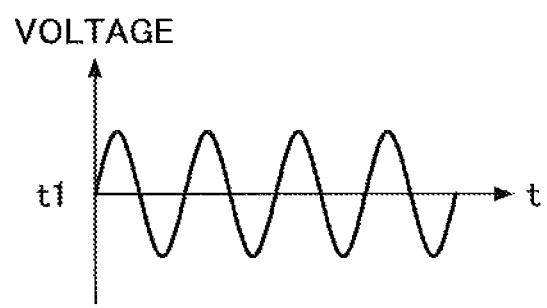
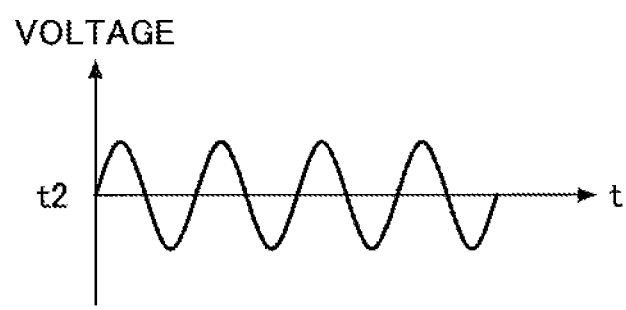
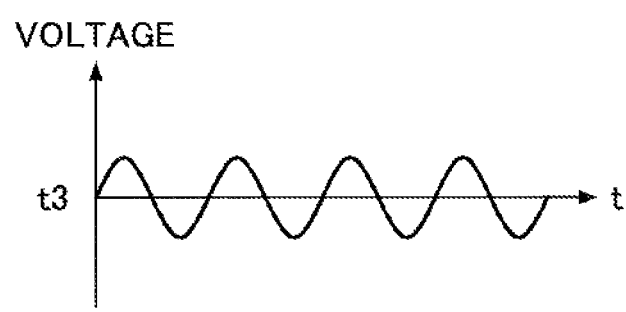

FIG.7B
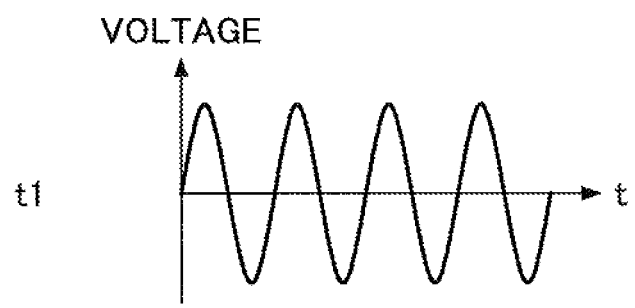
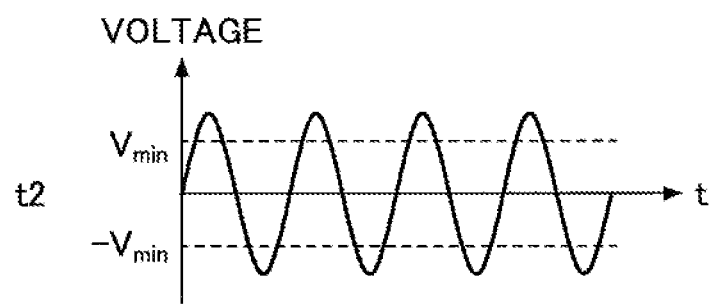
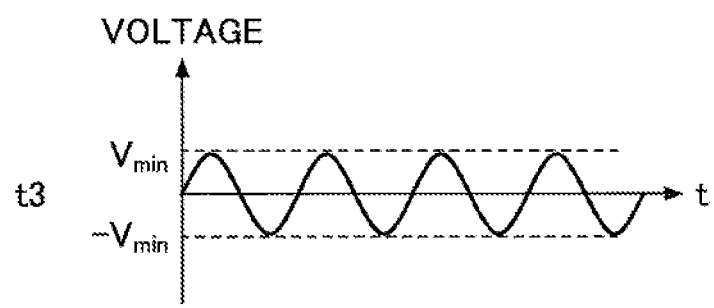

FIG.7C
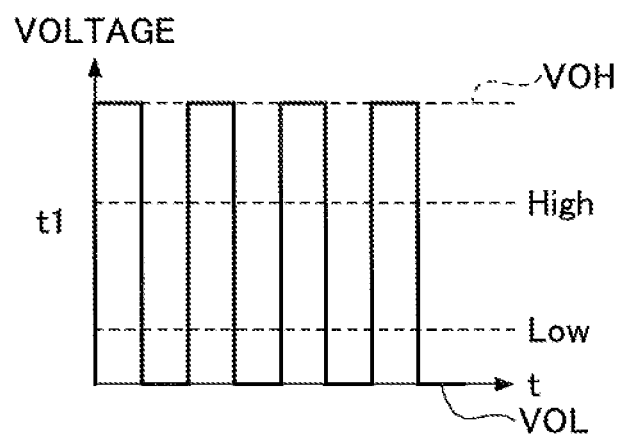
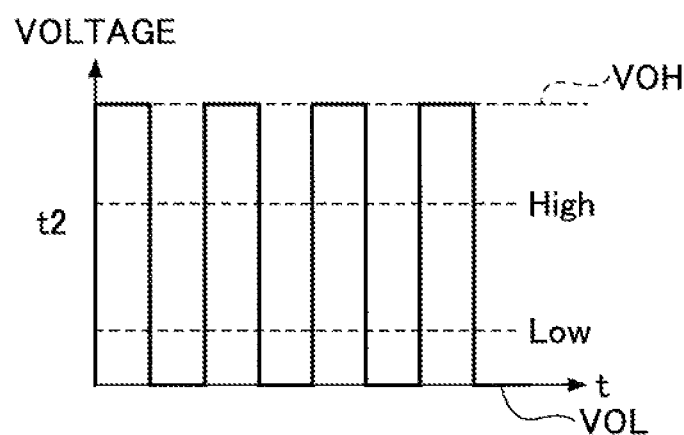
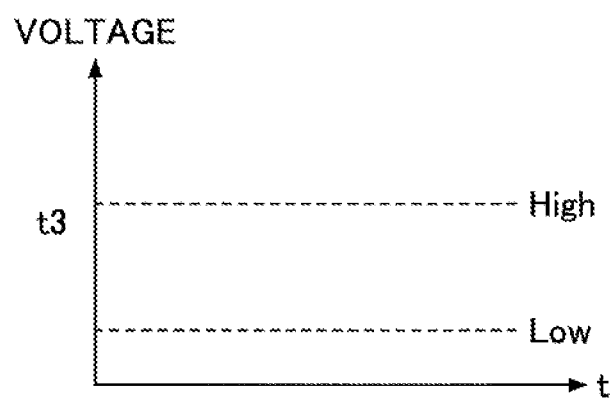

US 10,340,850 B2

CRYSTAL OSCILLATOR DEVICE AND METHOD OF MEASURING CRYSTAL OSCILLATOR CHARACTERISTIC

CROSS-REFERENCE TO RELATED APPLICATIONS

This present application is based upon and claims the benefit of priority of the prior Japanese Patent Application No. 2016-116463, filed on Jun. 10, 2016, the entire contents of which are incorporated herein by reference.

FIELD

The present disclosure relates to a crystal oscillator device and a method of measuring a characteristic of a crystal oscillator.

BACKGROUND

A crystal oscillator is known which includes a sub oscillator having sub electrodes provided separately from main electrodes on a crystal substrate.

[Patent Document 1] Japanese Laid-open Patent Publication No. 2011-135342

[Patent Document 2] Japanese Laid-open Patent Publication No. 2013-106052

However, according to the conventional technique as described above, it is difficult to detect a state of the crystal oscillator before a transition to an output stop state (for example, clock stop) based on a signal appearing in the sub electrodes. Such an output stop may occur suddenly due to abnormality of the crystal oscillator or the like.

SUMMARY

According to one aspect of the disclosure, a crystal oscillator device is provided, which includes: a crystal oscillator including a casing, a crystal piece, a pair of excitation electrodes configured to excite a main vibration, and a pair of sub vibration electrodes configured to excite a sub-vibration; and an alarm generator configured to generate an alarm based on a signal whose amplitude is equal to or less than a reference value, the signal being generated in the sub vibration electrodes.

The object and advantages of the embodiment will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 7A is a diagram illustrating a time-series waveform of a signal appearing at a point A in the case of an abnormal product.

FIG. 7B is a diagram illustrating a time-series waveform of a signal appearing at a point B in the case of an abnormal product.

FIG. 7C is a diagram illustrating a time-series waveform of a signal appearing at a point C in the case of an abnormal product.

DESCRIPTION OF EMBODIMENTS

In the following, embodiments are described in detail with reference to appended drawings.

First Embodiment

Figure 1A:
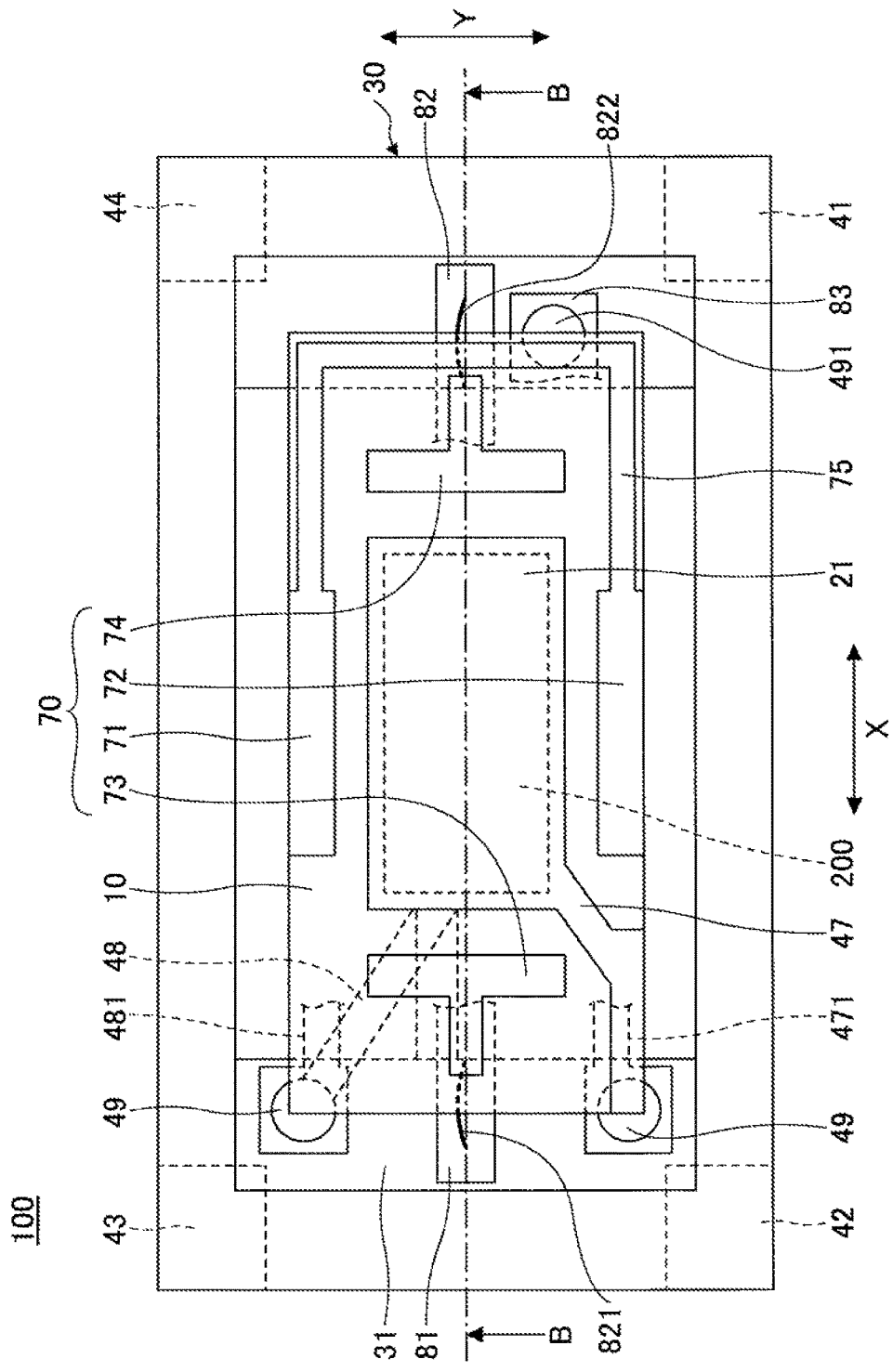
FIG. 1A is a top view schematically illustrating a configuration of a crystal oscillator according to a first embodiment.
Figure 1B:
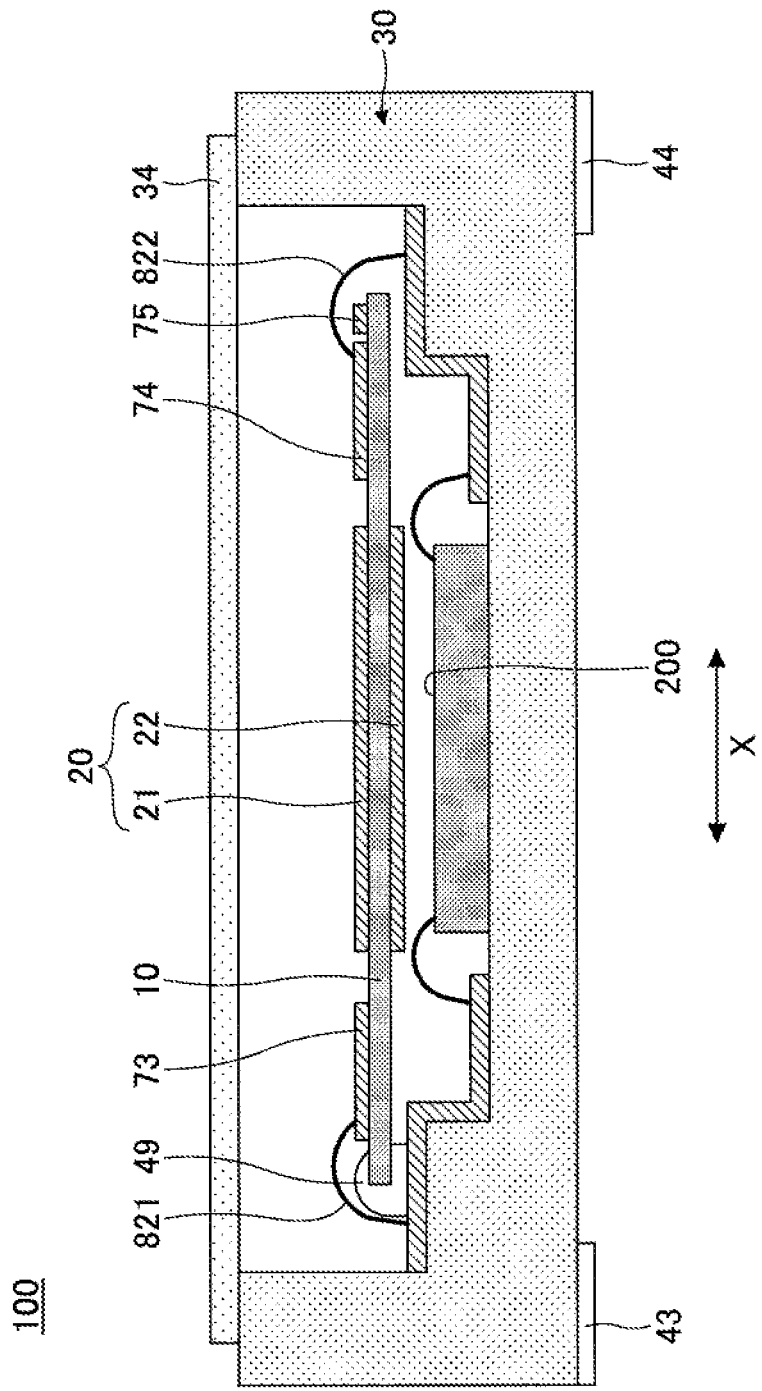
FIG. 1B is a cross-sectional view along a line B-B in FIG. 1A.

FIG. 1A is a top view schematically illustrating a configuration of a crystal oscillator 100 according to a first embodiment, and FIG. 1B is a cross-sectional view along a line B-B in FIG. 1A. In FIG. 1A, a lid of a casing 30 is not illustrated so that an inside can be seen, and invisible elements (an external electrode 41, etc.) are indicated by broken lines. Also, in FIG. 1A, illustration of some wirings is omitted for ease of viewing. It is noted that FIGS. 1A and 1B illustrate an IC 200 in addition to the crystal oscillator 100.

Hereinafter, a thickness direction of the crystal piece (crystal blank) 10 (vertical direction in FIG. 1B) is defined as the vertical direction, and the side of the casing 30 having the lid is referred to as "upper side". However, an orientation of the installation of the crystal oscillator 100 is arbitrary. In the following, an "outer surface" refers to a surface exposed to an outside of the casing 30, and an "inner surface" refers to a surface exposed to an inner space of the casing 30. Further, as illustrated in FIG. 1A, an X direction is defined as a direction corresponding to a direction of a main vibration direction of the crystal oscillator 100. As illustrated in FIG. 1A, Y direction is defined as a direction parallel to the surface of the crystal piece 10 and perpendicular to the main vibration direction of the crystal oscillator 100.

The crystal oscillator 100 includes a crystal piece 10, excitation electrodes 20, a casing 30, external electrodes 41 to 44, and sub vibration electrodes 70. As illustrated in FIGS. 1A and 1B, the crystal oscillator 100 is of a surface mounting type.

The crystal piece 10 may be, for example, an AT-cut artificial quartz crystal substrate. An outer shape of the crystal piece 10 is arbitrary, and in the first embodiment, it is a rectangle, but other shapes may be used. The crystal piece 10 may be supported on the casing 30 at both sides in X direction, or may be cantilevered. In the example illustrated in FIGS. 1A and 1B, the crystal piece 10 is supported on a bank portion 31 of the casing 30 on both sides in X direction via a conductive adhesive 49 and a conductive adhesive 491. When the crystal oscillator 100 is driven, the crystal piece vibrates in the X direction (thickness shear vibration). Hereinafter, the vibration in X direction (thickness shear vibration) of the crystal piece 10 is also referred to as "main vibration".

The excitation electrodes 20 excite the crystal piece 10. The excitation electrodes 20 include an upper excitation electrode 21 provided on the upper surface of the crystal piece 10 and a lower excitation electrode 22 provided on the lower surface of the crystal piece 10. The excitation electrodes 20 excite the crystal piece 10 by a potential difference between the upper excitation electrode 21 and the lower excitation electrode 22. It is noted that the excitation electrodes 20 may be made of gold, silver, aluminum, or the like.

The excitation electrodes 20 are electrically connected to an IC (Integrated Circuit) 200. The way of electrically connecting the excitation electrodes 20 and the IC 200 is arbitrary. In the example illustrated in FIGS. 1A and 1B, the upper excitation electrode 21 is electrically connected to the IC 200 via a conductive pattern 47 formed on an upper surface of the crystal piece 10, an electrically conductive adhesive 49, and a conductive pattern 471 (only a part thereof is illustrated) formed on an inner surface of a lower part of the casing 30. Further, the lower excitation electrode 22 is electrically connected to the IC 200 via a conductive pattern 48 formed on a lower surface of the crystal piece 10, an electrically conductive adhesive 49, and a conductive pattern 481 (only a part thereof is illustrated) formed on an inner surface of a lower part of the casing 30.

The casing 30 accommodates the crystal piece 10. The casing 30 is made of, for example, a ceramic material. In this case, the casing 30 may be, for example, a ceramic package formed by laminating ceramic material layers. The casing 30 includes a lid 34 (see FIG. 1B and the like), and hermetically encloses the crystal piece 10 in an internal space (cavity) thereof. For example, the internal space of the casing 30 under vacuum or filled with dry nitrogen and sealed with the lid 34. It is noted that the lid 34 may be a metal plate or a ceramic plate.

The external electrodes 41 to 44 are provided on the casing 30. In the example illustrated in FIGS. 1A and 1B, the external electrodes 41 to 44 are provided on an outer surface of the lower part of the casing 30. The external electrodes 41 to 44 may be electrically connected to the IC 200. The way of electrically connecting the external electrodes 41 to 44 and the IC 200 is arbitrary, and illustration of the wirings is omitted. The external electrodes 41 to 44 may be used to electrically connect the IC 200 to ground and a power supply (both not illustrated) and to extract signals from an alarm output terminal 222 and a clock output terminal 220 (see FIG. 2) of the IC 200.

The sub vibration electrodes 70 are provided so as to be able to detect (pick up) an alternating electric field generated due to the sub vibration of the crystal oscillator 100 in the oscillating state. The sub vibration electrodes 70 are formed on the crystal piece 10. In the oscillated state of the crystal oscillator, the sub oscillation occurs in addition to the thickness shear vibration (main oscillation) of the crystal piece 10. The sub vibration is accompanied by a change in the contour of the crystal piece 10 and is referred to as a contour vibration (see FIG. 2). In the first embodiment, as an example, the sub vibration electrode 70 are arranged so as to be able to detect an alternating electric field generated due to the contour vibration of the crystal oscillator 100. When the crystal oscillator 100 is in the oscillation state, the sub vibration of the crystal piece 10 also occurs, and the level of the sub vibration is substantially correlated with the level of the main vibration although the level of the sub vibration is significantly lower than the level of the main vibration.

The sub vibration electrodes 70 include first to fourth sub electrodes 71 to 74. The first to fourth sub electrodes 71 to 74 are provided on the surface of the crystal piece 10. The first to fourth sub electrodes 71 to 74 are provided around the upper excitation electrode 21 such that the first to fourth sub electrodes 71 to 74 are separated from the upper excitation electrode 21. The sub vibration electrodes 70 are electrically connected to the IC 200. It is noted that the electrical connection between the sub vibration electrodes 70 and the IC 200 may be realized by an arbitrary way.

In the example illustrated in FIGS. 1A and 1B, the first to fourth sub electrodes 71 to 74 are formed as follows. The first to fourth sub electrodes 71 to 74 are provided on the upper surface of the crystal piece 10. The first sub electrode 71 and the second sub electrode 72 are arranged in such a manner as to sandwich the upper excitation electrode 21 in Y direction. The third sub electrode 73 and the fourth sub electrode 74 are arranged in such a manner as to sandwich the upper excitation electrode 21 in X direction. The first sub electrode 71 is electrically connected to ae first casing-side electrode 81 formed on the bank portion 31 via a wire 821 by wire bonding. Similarly, the fourth sub electrode 74 is electrically connected to a second casing-side electrode 82 formed on the bank portion 31 via a wire 822 by wire bonding. The first sub electrode 71 and the second sub electrode 72 are electrically connected via a conductor pattern 75 formed on the upper surface of the crystal piece 10. The conductor pattern 75 is electrically connected to a third casing-side electrode 83 via the electrically conductive adhesive 491. The first to third casing-side electrodes 81 to 83 are electrically connected to the IC 200 via conductor patterns (not illustrated) formed on the inner surface of the lower part of the casing 30, respectively. Thus, the first to fourth sub electrodes 71 to 74 are electrically connected to the IC 200.

As described above, the IC 200 is electrically connected to the excitation electrodes and the sub vibration electrodes 70 of the crystal oscillator 100. The IC 200 forms an example of a crystal oscillator device together with the crystal oscillator 100. In the example illustrated in FIGS. 1A and 1B, the IC 200 is provided on an inner surface of the lower portion of the casing 30. That is, the IC 200 is provided in the internal space of the casing 30. However, in the modified example, the IC 200 may be provided outside the casing 30. In this case, for example, the excitation electrodes 20 and the sub vibration electrodes 70 may be electrically connected to the external electrodes 41 to 44, respectively, and the IC 200 may be electrically connected to the external electrodes 41 to 44.

Figure 2:
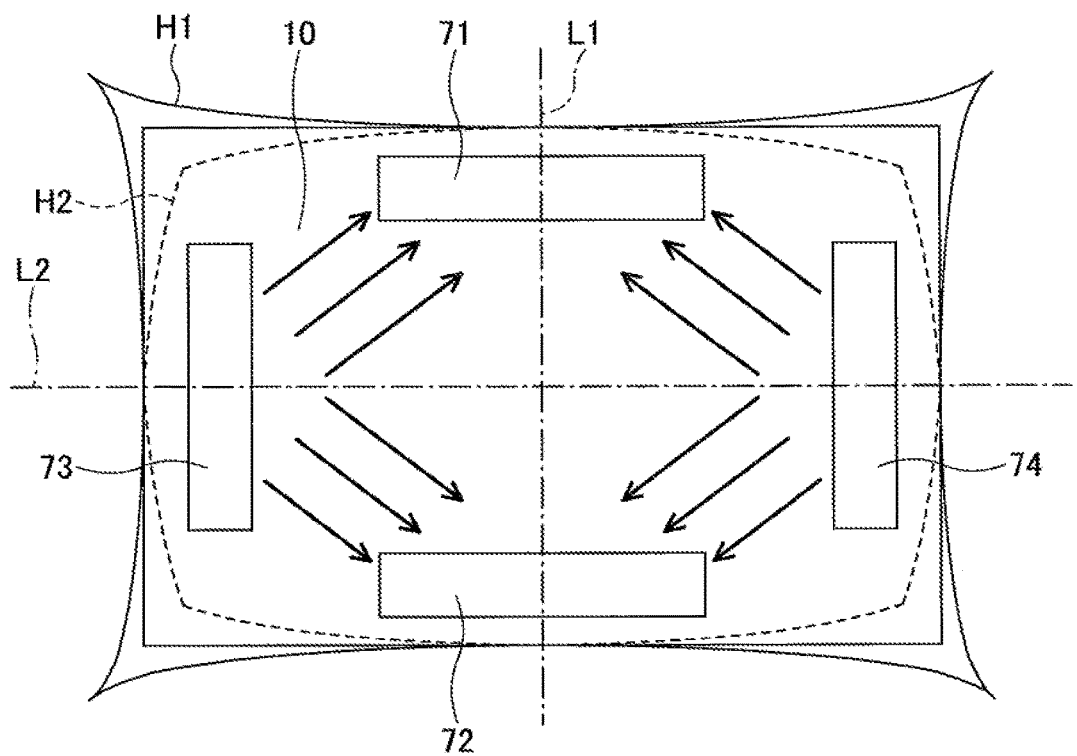
FIG. 2 is a diagram explaining a sub vibration.

FIG. 2 is an explanatory diagram of the sub vibration, and schematically illustrates only the crystal piece 10 and the sub vibration electrodes 70 in a top view. In FIGS. 2, H1 and H2 schematically represent a change in the outer shape (contour) of the crystal piece 10 caused by the displacement due to the sub vibration. In FIG. 2, arrows between the first to fourth sub electrodes 71 to 74 represent the electric field direction generated between the first to fourth sub electrodes 71 to 74 at a certain timing in the crystal oscillator 100 in the oscillating state.

In the crystal oscillator 100 in the oscillating state, an alternating electric field is generated between the first sub electrode 71 and the third sub electrode 73, between the first sub electrode 71 and the fourth sub electrode 74, between the second sub electrode 72 and the third sub electrode 73, and between the second sub electrode 72 and the fourth sub electrode 74. The electric field arrow illustrated in FIG. 2 indicates the direction of the electric field. At this time, the crystal piece 10 is displaced in the manner illustrated in the outer shape H1. It is noted that, when the crystal piece 10 is displaced in the manner illustrated by the external form H2, an electric field in the direction opposite to the electric field direction illustrated in FIG. 2 is generated. In this way, an alternating electric field is generated between the first to fourth sub electrodes 71 to 74 due to the sub vibration of the crystal oscillator 100. It is noted that a support point (the position of the electrically conductive adhesive 49) of the crystal piece 10 may be set on nodal lines L1, L2 or near the nodal lines L1, L2 in order to minimize the influence of the support point on the contour vibration, unlike the example illustrated in FIG. 1A.

Figure 3:
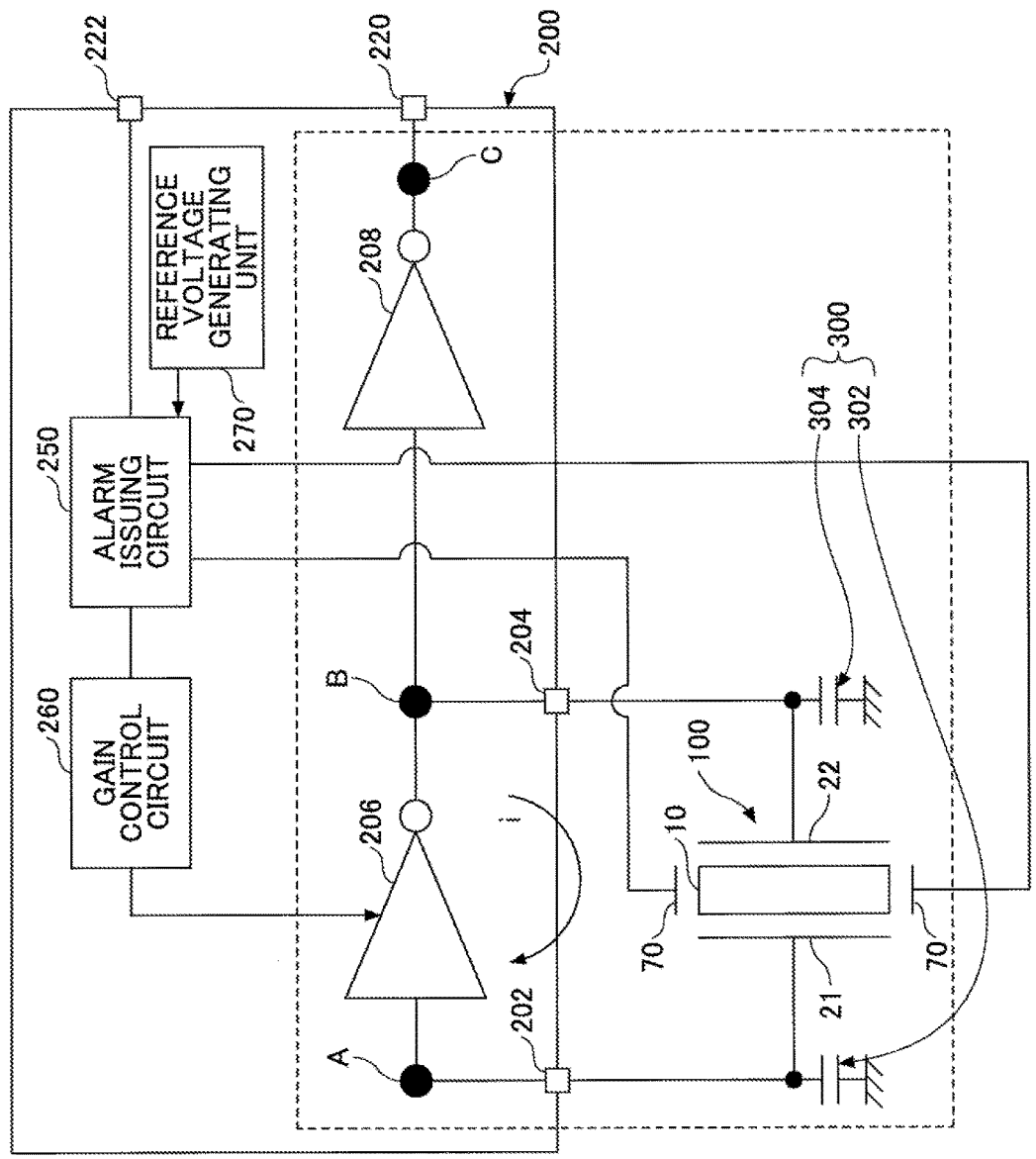
FIG. 3 is a diagram schematically illustrating an example (first embodiment) of a circuit configuration of a crystal oscillator device including a crystal oscillator and an IC.

FIG. 3 is a diagram schematically illustrating an example of a circuit configuration of the crystal oscillator device including the crystal oscillator 100 and the IC 200. In FIG. 3, with respect to IC 200, capacitors of terminals, stray capacitance of wiring patterns of the printed circuit board, resistance for limiting the current (see arrow i in FIG. 3) flowing through the crystal oscillator 100, etc., are not illustrated.

In the example illustrated in FIG. 3, the upper excitation electrode 21 and the lower excitation electrode 22 of the crystal oscillator 100 are electrically connected to an input terminal 202 and an output terminal 204 of the IC 200, respectively. However, the lower excitation electrode 22 and the upper excitation electrode 21 of the crystal oscillator 100 may be connected to the input terminal 202 and the output terminal 204 of the IC 200, respectively. The crystal oscillator 100 cooperates with the IC 200 to generate a clock (reference clock) used in an arbitrary device (for example, a communication control device such as a base station device or a relay station device).

A matching capacitor 300 is electrically connected to the crystal oscillator 100. Specifically, a first capacitor 302 is electrically connected between the upper excitation electrode 21 of the crystal oscillator 100 and ground, and a second capacitor 304 is electrically connected between the lower excitation electrode 22 of the crystal oscillator 100 and ground. The matching capacitor 300 is provided for adjustment (matching adjustment) so that the output frequency (initial value) of the crystal oscillator 100 becomes a desired value (designed value) when the total capacitance (load capacitance value) in the overall circuit of the IC 200 including the crystal oscillator 100 is added. It is noted that, in FIG. 3, an area surrounded by a dotted line forms an oscillation circuit.

The IC 200 includes an inverting amplifier 206, an output buffer (buffer circuit) 208, an alarm issuing circuit 250 (an example of an alarm generator), a gain control circuit 260 (an example of a gain control unit), and a reference voltage generating unit 270.

As described above, the inverting amplifier 206 inverts and amplifies the output of the crystal oscillator 100 (the signal input from the upper excitation electrode 21 to the input terminal 202). That is, the signal input from the upper excitation electrode 21 to the input terminal 202 is inverted and amplified by the inverting amplifier 206. The inverted and amplified signal is input to the output buffer 208 and input to the lower excitation electrode 22 via the output terminal 204.

The gain (gain) of the inverting amplifier 206 is variable. It is noted that the inverting amplifier 206 may be of a type that is used for AGC (Automatic Gain Control) (for example, a type that uses a variable resistor or a field effect transistor as a variable resistance element). However, in the first embodiment, control for adjusting the gain of the inverting amplifier 206 (i.e., the automatic gain control) to always keep the output constant is not performed, as described hereinafter. That is, no automatic gain control circuit is provided. As a result, since a circuit configuration for automatic gain control becomes unnecessary, a simple configuration can be realized, and power saving can be achieved.

Figure 4:
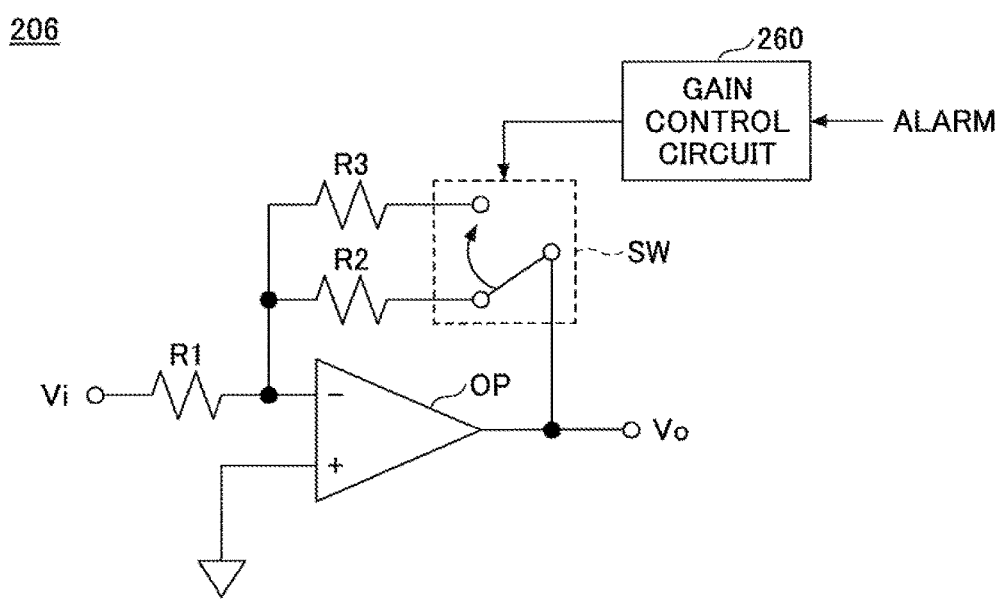
FIG. 4 is a diagram for illustrating an example of an inverting amplifier.

In the first embodiment, as an example, as illustrated in FIG. 4, the inverting amplifier 206 includes an operational amplifier OP, a resistor R2 (an example of a first resistor), and a resistor R3 (an example of a second resistor). The resistors R2 and R3 are provided in parallel on a line which is provided for returning the output of the operational amplifier OP to the inverting terminal. The inverting amplifier 206 further includes a switch SW. The switch SW has a first state in which an inverting terminal of the operational amplifier OP is electrically connected to an output terminal of the operational amplifier OP via the resistor R2, and a second state in which the inverting terminal of the operational amplifier OP is electrically connected to the output terminal of the operational amplifier OP via the resistor R3. The state of the switch SW is controlled by the gain control circuit 260. In the first state, the relationship between the input voltage Vi and the output voltage Vo is $Vo=R2/R1 \times Vi$, and R2/R1 is the amplification factor. In the second state, the relationship between the input voltage Vi and the output voltage Vo is $Vo=R3/R1 \times Vi$, and R3/R1 is the amplification factor. For example, if R3>R2, since R3/R1>R2/R1, the amplification factor (that is, the gain of the inverting amplifier 206) becomes higher in the second state than in the first state. According to the example illustrated in FIG. 4, it is possible to realize the inverting amplifier 206 whose gain is variable with a simple configuration, as compared with the inverting amplifier of the type using a variable resistor or the like.

The output buffer 208 may be formed by a CMOS (Complementary Metal Oxide Semiconductor), for example. The output buffer 208 generates a signal (pulse signal) representing the oscillation state of the crystal oscillator 100 based on the input signal (the signal inverted and amplified by the inverting amplifier 206). The output buffer 208 outputs "voltage VOH" when the level of the input signal (hereinafter also referred to as "input level") exceeds a first threshold value and outputs "voltage VOL" when the input level becomes lower than a second threshold value. It is noted that the first threshold value and the second threshold value may be set to the same or may be set differently, depending on a voltage value (threshold level) at which a P-type MOS and a N-type MOS, which form the CMOS of the output buffer 208, are turned on/off. In this way, in the example illustrated in FIG. 3, the output of the crystal oscillator 100 is not directly output from the crystal oscillator 100 but is output to the clock output terminal 220 via the output buffer 208.

The alarm issuing circuit 250 has a function (hereinafter referred to as "pre-output stop state detection function") for detecting a state (hereinafter referred to as "pre-output stop state") before the crystal oscillator 100 stops outputting. It is noted that, the fact that the crystal oscillator 100 stops outputting means that the oscillation circuit stops outputting. The fact that the crystal oscillator 100 stops outputting means the transition to the state in which the output from the output buffer 208 does not change (i.e., the state in which a normal output, which alters between "VOH" and "VOL" at the cycle corresponding to the output frequency of the crystal oscillator 100, cannot be obtained.

The alarm issuing circuit 250 is electrically connected to the sub vibration electrodes 70. The alarm issuing circuit 250 realizes the pre-output stop state detection function by monitoring a signal (hereinafter also referred to as a "sub vibration signal") appearing in the sub vibration electrodes 70. The alarm issuing circuit 250 generates an alarm when the amplitude of the sub vibration signal becomes equal to or less than a predetermined reference value $\beta$. The amplitude of the sub vibration signal may be based on the difference between the maximum value and the average value of the level of the sub vibration signal for the most recent predetermined period, the difference between the average value and the minimum value of the level of the sub vibration signal for the latest predetermined period, half of the difference between the maximum value and the minimum value of the level of the sub vibration signal for the latest predetermined period, etc. It is noted that the alarm issuing circuit 250 may use the maximum value of the level of the sub vibration signal for the latest predetermined period as the amplitude of the sub vibration signal. This is because, for example, the maximum value of the sub vibration signal level of the most recent one cycle is correlated with the amplitude of the same sub vibration signal in the same cycle. Alternatively, the alarm issuing circuit 250 may use integrated value of the amplitude values of the sub vibration signal over the latest predetermined period as the amplitude of the sub vibration signal.

As described above, the reference value $\beta$ is set to a value greater than the amplitude Em of the sub vibration signal when the amplitude of the input to the output buffer 208 becomes the input lower limit value. For example, the reference value $\beta$ may be $\beta=1.1 \times Em$ or $\beta>1.1 \times Em$. The input lower limit value of the output buffer 208 corresponds to the lower limit value of the input level (magnitude of the input voltage) to the output buffer 208 when the output is obtained from the output buffer 208. That is, even if the input to the output buffer 208 alters periodically, a significant output from the output buffer 208 (an output that can function as a clock source) cannot be obtained in a state in which the level of the input to the output buffer 208 is below a certain lower limit value and thus the CMOS is not turned on/off. The input lower limit value of the output buffer 208 corresponds to the lower limit value. It is noted that the reference value $\beta$ may be uniformly set based on a design value of the input lower limit value of the output buffer 208. Alternatively, the reference value $\beta$ may be set for each individual based on measured values for individuals, corresponding to input lower limit values or the like which may differ for each individual of the output buffer 208. In this case, for example, the reference value $\beta$ may be set based on an actually measured value at the time of shipment of a product including the crystal oscillator 100 and the IC 200 (for example, an actually measured value of the amplitude Em).

The alarm generated by the alarm issuing circuit 250 is output to the outside via the alarm output terminal 222 and input to the gain control circuit 260. It is noted that the alarm output via the alarm output terminal 222 may be transmitted to, for example, an external user device (not illustrated). When the output of the crystal oscillator 100 functions as a clock of the communication control device, the user device may be, for example, a central management server that manages a base station or the like. In this case, the alarm may be a signal causing an alarm output including a voice or a display, or may include information of an index value (for example, the current value of the amplitude of the sub vibration signal) representing the lowered state of the current oscillation level. Upon receipt of such an alarm output, for example, a user who is a telecommunications carrier, can plan the repair/replacement work for the communication control device that includes the crystal oscillator 100 (the crystal oscillator 100 in which the pre-output stop state was detected).

The gain control circuit 260 has a function of increasing the gain of the inverting amplifier 206 in synchronization with the occurrence of the alarm. That is, when an alarm from the alarm issuing circuit 250 is input, the gain control circuit 260 increases the gain of the inverting amplifier 206 from a first value to a second value. The second value is significantly greater than the first value, for example the maximum value of the variable range. This increases the amplitude of the output from the inverting amplifier 206 and increases the amplitude of the input to the output buffer 208. In the example illustrated in FIG. 4, when the alarm from the alarm issuing circuit 250 is input, the gain control circuit 260 controls the switch SW to switch from the first state to the second state (see the arrow in FIG. 4). As a result, the gain of the inverting amplifier 206 increases from R2/R1 to R3/R1.

The gain control circuit 260 maintains the gain of the inverting amplifier 206 at the first value until the alarm from the alarm issuing circuit 250 is input, and when the alarm is input, the gain of the inverting amplifier 206 is set to the second value, and thereafter, the gain of the inverting amplifier 206 is maintained at the second value. In this case, the first value (R2/R1) is smaller than the second value (R3/R1). Accordingly, while power saving is implemented until the alarm from the alarm issuing circuit 250 is input, the state in which the gain of the inverting amplifier 206 is increased can be maintained after the alarm from the alarm issuing circuit 250 is input.

The reference voltage generating unit 270 generates a voltage corresponding to the reference value $\beta$, used in the alarm issuing circuit 250. For example, the voltage generated by the reference voltage generating unit 270 may be input to a comparator (not illustrated) of the alarm issuing circuit 250.

Next, with reference to FIGS. 5 to 7D, effects of the first embodiment are described. Hereinafter, in some cases, the effects of the first embodiment will be described in comparison with a comparative example which does not include the gain control circuit 260.

Figure 5:
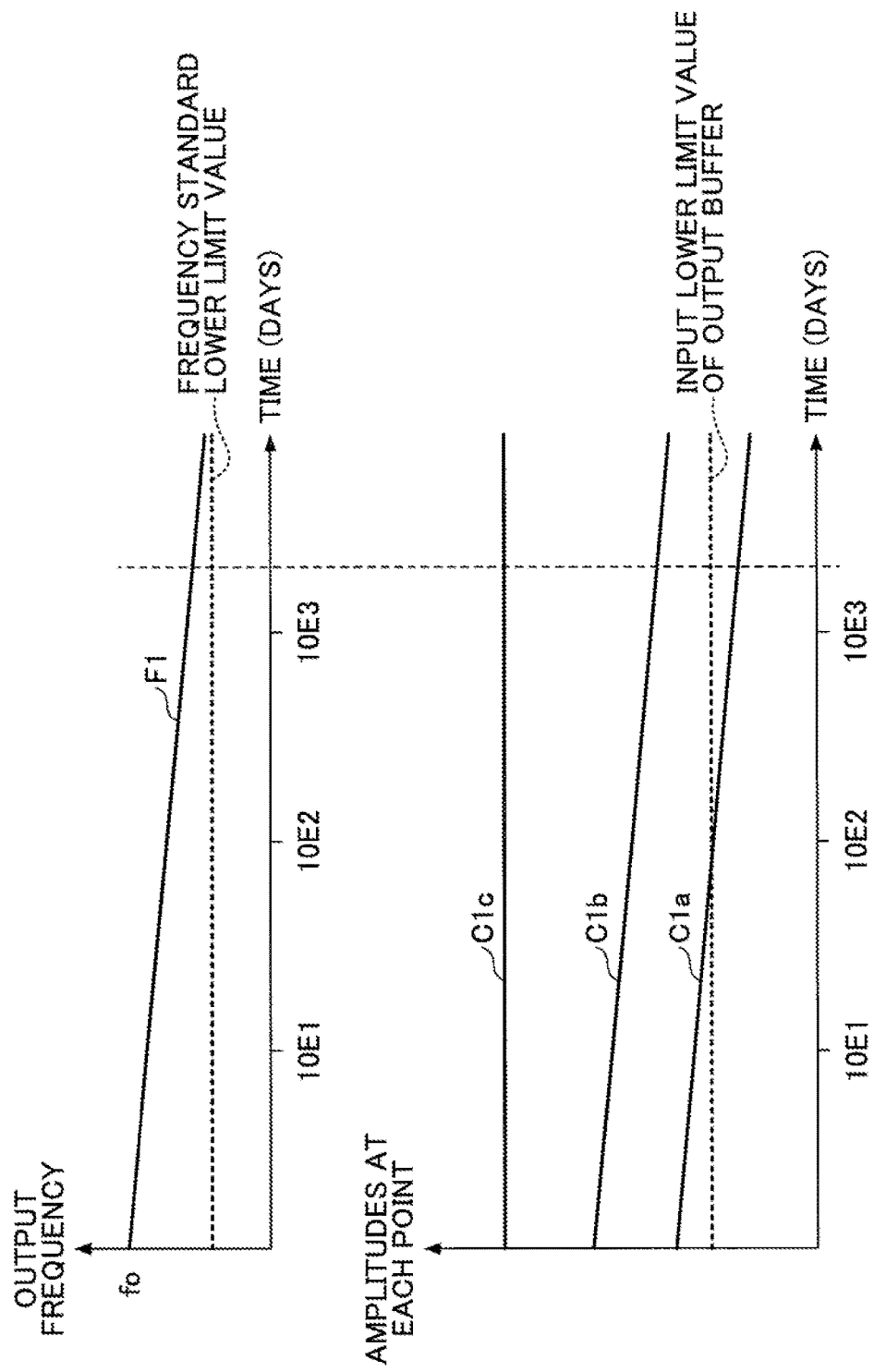
FIG. 5 is an explanatory diagram of characteristics in a case where the crystal oscillator is a normal product.

FIG. 5 is an explanatory diagram of characteristics in a case where the crystal oscillator 100 is a normal product.

FIG. 5 illustrates, on the upper side, a frequency characteristic diagram illustrating the time-varying characteristics of the output frequency of the crystal oscillator 100, taking the time on the horizontal axis and the output frequency of the crystal oscillator 100 on the vertical axis. In the frequency characteristic diagram, a frequency standard lower limit value with respect to the output frequency of the crystal oscillator 100 is illustrated, and the time variation characteristic F1 related to a normal product is illustrated.

FIG. 5 illustrates, on the lower side, an output change characteristic diagram indicating the time-varying characteristics C1a, C1b, C1c of the amplitudes at each point A, B, C, respectively, taking the time on the horizontal axis and the amplitude of the signal appearing at each point A, B, C in the oscillation circuit illustrated in FIG. 3 on the vertical axis. In the output change characteristic diagram, the input lower limit value of the output buffer 208 is also illustrated.

In the case of a normal product, the output frequency of the crystal oscillator 100 decreases from the value f0 in a proportional manner with respect to the exponential increase in time, as illustrated by the time variation characteristic F1 on the upper side of FIG. 5 due to aging (aged deterioration). However, in the case of a normal product, the output frequency of the crystal oscillator 100 does not fall below the frequency standard lower limit value before the design life (for example, 6 years). It is noted that the main cause of the frequency change is the oxidation of the excitation electrodes 20 of the crystal oscillator 100. The amount of the frequency change due to aging can be controlled to some extent by management of the manufacturing process or the like. If the crystal oscillator 100 is as designed, the output frequency of the crystal oscillator 100 does not fall below the frequency standard lower limit value before the design life, as illustrated in FIG. 5.

In the case of a normal product, the amplitude of the signal appearing at the point B in the oscillation circuit illustrated in FIG. 3 decreases due to aging as indicated by the time variation characteristic C1b on the lower side of FIG. 5. As in the case of the frequency change, the main cause of the amplitude change is the mass increase due to the oxidation of the excitation electrode 20 of the crystal oscillator 100. However, in the case of a normal product, before the design life, the amplitude of the signal appearing at the point B illustrated in FIG. 3 does not fall below the input lower limit value of the output buffer 208. That is, if the crystal oscillator device is configured as designed, the amplitude of the input to the output buffer 208 does not fall below the input lower limit value before the design life. Therefore, in the case of a normal product, the amplitude of the signal appearing at the point C illustrated in FIG. 3 does not change and is constant as indicated by the time variation characteristic C1c on the lower side of FIG. 5. That is, in the case of a normal product, until the design life, the output (that is, normal output) switching between "VOH" and "VOL" at the cycle corresponding to the output frequency of the crystal oscillator 100 can be obtained at the point C illustrated in FIG. 3.

Figure 6:
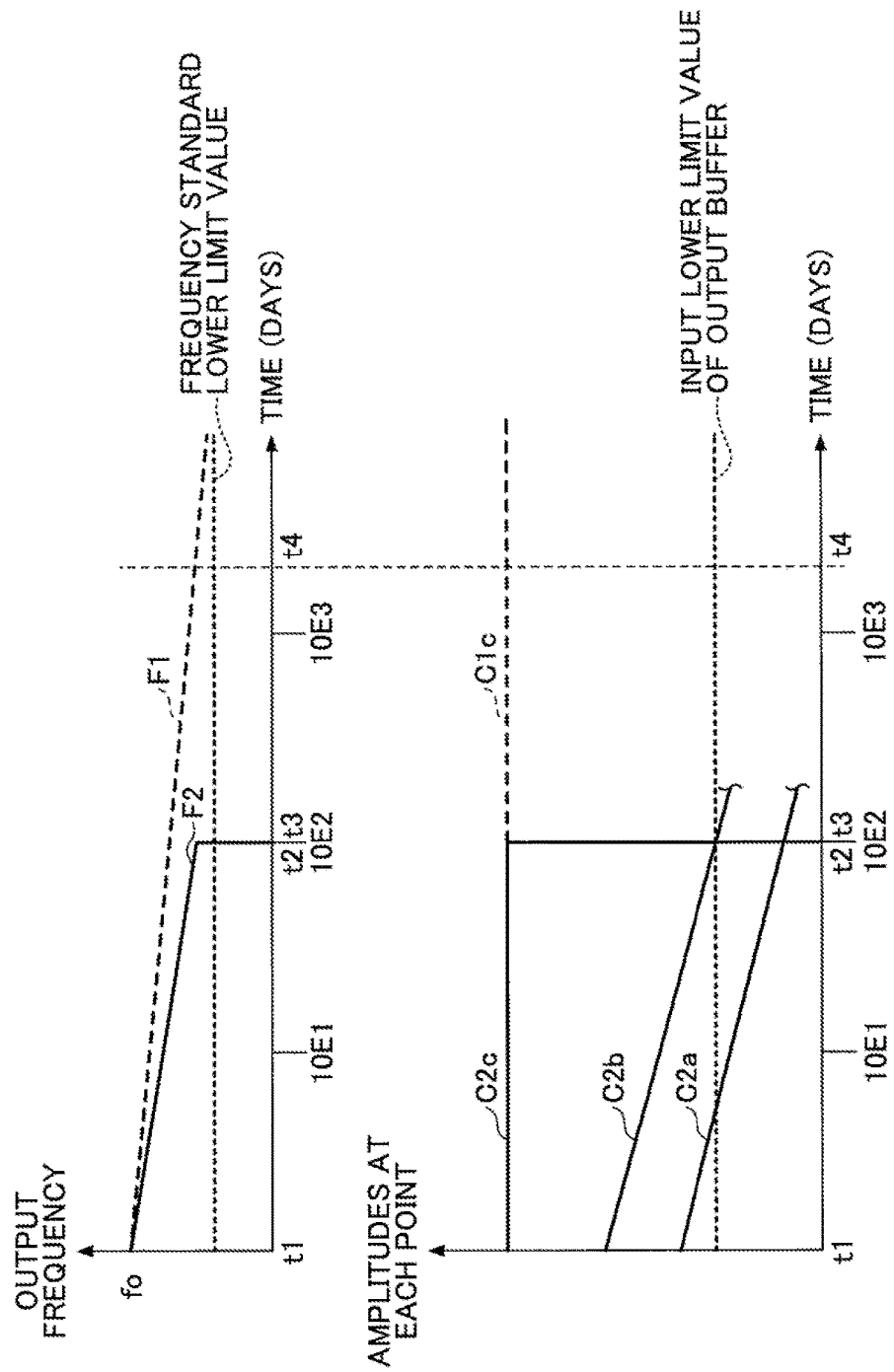
FIG. 6 is an explanatory diagram of an output stop event of the crystal oscillator due to abnormality.
Figure 7D:
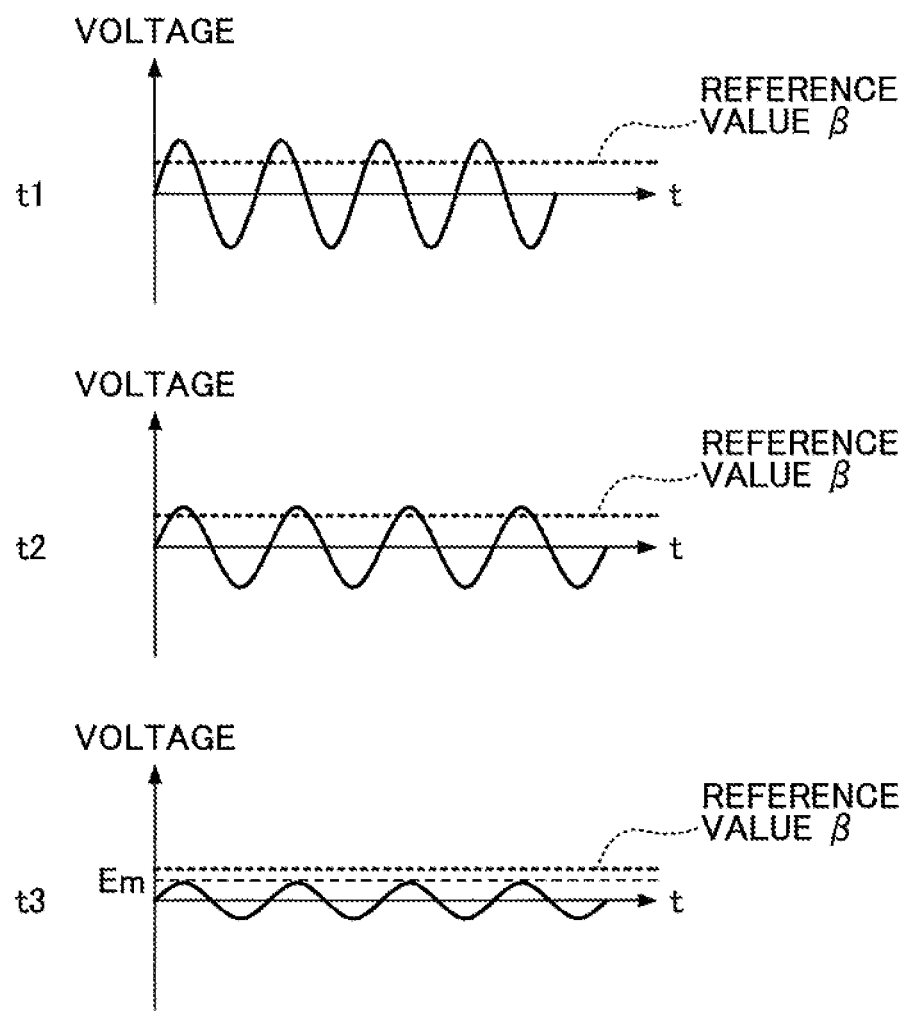
FIG. 7D is a diagram illustrating a time-series waveform of a signal appearing in sub vibration electrodes in the case of an abnormal product.

FIGS. 6 to 7D are explanatory diagrams of output stoppage of the crystal oscillator 100 caused by abnormality. In FIG. 6, t1 represents a time point at which the crystal oscillator 100 starts to operate, t2 represents a time point immediately before the crystal oscillator 100 stops outputting, t3 represents a time point when the crystal oscillator 100 stops outputting, and t4 represents the point of design life.

FIG. 6 illustrates, on the upper side, a frequency characteristic diagram illustrating the time-varying characteristics of the output frequency of the crystal oscillator 100, taking the time on the horizontal axis and the output frequency of the crystal oscillator 100 on the vertical axis. In the frequency characteristic diagram, the frequency standard lower limit value with respect to the output frequency of the crystal oscillator 100 is illustrated, and the time variation characteristic F1 (dotted line) related to a normal product and the time variation characteristic F2 (solid line) related to an abnormal product that stops outputting before the design life are illustrated. As an example, the time variation characteristic F2 relating to an abnormal product indicates a case where the output stops after about 100 days from the start of operation.

FIG. 6 illustrates, on the lower side, an output change characteristic diagram indicating the time-varying characteristics C2a, C2b, C2c (i.e., the time-varying characteristics related to an abnormal product) of the amplitudes at each point A, B, C, respectively, taking the time on the horizontal axis and the amplitude of the signal appearing at each point A, B, C in the oscillation circuit illustrated in FIG. 3 on the vertical axis. In the output change characteristic diagram, the input lower limit value of the output buffer 208, and the time variation characteristic C1c (dotted line) related to a normal product are also illustrated.

FIGS. 7A to 7D are diagrams illustrating time-series waveforms of the signal appearing in the case of an abnormal product. FIG. 7A illustrates the waveform of the signal appearing at point A illustrated in FIG. 3. FIG. 7B illustrates the waveform of the signal appearing at point B illustrated in FIG. 3. FIG. 7C illustrates the waveform of the signal appearing at point C illustrated in FIG. 3. FIG. 7D illustrates the waveform of the signal appearing in the sub vibration electrodes 70. In FIG. 7A to FIG. 7D, from the top, the waveform within a certain time period from the time point t1, the waveform within a certain time period before time point t2, and the waveform within a certain time period from time point t3 are illustrated. In FIG. 7B, a positive voltage value Vmin having the same magnitude as the input lower limit value and a negative voltage value Vmin having the same magnitude as the input lower limit value are also illustrated. In addition, in FIG. 7C, the voltage level "High" to be exceeded in a positive direction by the output VOH and the voltage level "Low" to be exceeded in a negative direction by the output VOL are also illustrated. In addition, the reference value β is also illustrated in FIG. 7D.

Here, there are cases where the decrease rate of the output frequency of the crystal oscillator 100 and the oscillation level become significant due to abnormality of a manufacturing process or contamination from contaminants. In such a case, an abnormal product that causes output stoppage before the design life may be generated.

Specifically, in the case of an abnormal product, the output frequency of the crystal oscillator 100 decreases from the initial value f0 with decrease speed significantly higher than the decrease speed due to aging in a normal product, as illustrated in the time variation characteristic F2 on the upper side of FIG. 6. In the case where the output of the crystal oscillator 100 is used as the clock of the standalone system, even if the frequency decrease progresses up to the time t2, there is a possibility that the frequency decrease may be permissible with a slight decrease in calculation speed. However, at time t3, the output suddenly stops and the whole system goes down.

More specifically, in the case of an abnormal product, the amplitude of the signal appearing at the point A in the oscillation circuit illustrated in FIG. 3 decreases by a significantly greater amount than the decrease amount due to aging in the case of a normal product, as illustrated in the time variation characteristic C2a on the lower side in FIG. 6 and FIG. 7A. Correspondingly, in the case of an abnormal product, the amplitude of the signal appearing at the point B in the oscillation circuit illustrated in FIG. 3 decreases by a significantly greater amount than the decrease amount due to aging in the case of a normal product, as illustrated in the time variation characteristic C2b on the lower side in FIG. 6 and FIG. 7B. Thus, in the case of an abnormal product, before the design life, the amplitude of the signal appearing at the point B illustrated in FIG. 3 may fall below the input lower limit value of the output buffer 208.

In this respect, in the case of an abnormal product illustrated in FIG. 6, in the comparative example, the amplitude of the signal appearing at the point B in the oscillation circuit illustrated in FIG. 3 falls below the input lower limit value of the output buffer 208 at the time t3, as illustrated in the time variation characteristic C2b on the lower side of FIG. 6 and FIG. 7B. In this way, in the case of an abnormal product illustrated in FIG. 6, the amplitude of the signal appearing at the point B in the oscillation circuit illustrated in FIG. 3, that is, the amplitude of the input to the output buffer 208 falls below the input lower limit value before the design life. If the amplitude of the input to the output buffer 208 falls below the input lower limit value of the output buffer 208, the signal level appearing at the point C illustrated in FIG. 3 becomes a constant value 0, as illustrated in the time variation characteristic C2c on the lower side of FIG. 6 and FIG. 7C. That is, prior to the design life, the crystal oscillator 100 stops outputting while the crystal oscillator 100 remains in the oscillation state (see FIG. 7A).

Here, the abnormality of the crystal oscillator 100 often causes abnormal frequency change. Since the oscillation circuit including the crystal oscillator 100 itself is a clock generation source, a reference clock with higher accuracy may be required to directly detect the frequency change of the crystal oscillator 100. Therefore, it is difficult to detect the abnormality in the frequency of the crystal oscillator 100 (for example, a characteristic like the time variation characteristic F2 in FIG. 6) by a simple method.

In this respect, the frequency change of the crystal oscillator 100 due to contamination from contaminants or the like correlates with the change (decrease) in the oscillation level of the crystal oscillator 100 as illustrated in FIGS. 6 and 6. This is because, in the case where the mass of the excitation electrodes 20 is increased due to contamination from contaminants, for example, both the output frequency and the oscillation level of the crystal oscillator 100 are reduced due to the mass increase. Therefore, even when the frequency change of the crystal oscillator 100 cannot be directly detected, it may be possible to indirectly detect the frequency change of the crystal oscillator 100 by monitoring the oscillation level of the crystal oscillator 100.

On the other hand, as described above, the output of the crystal oscillator 100 is not directly output from the oscillation circuit including the crystal oscillator 100 but output through the output buffer 208. As illustrated in FIG. 6, etc., as long as the amplitude of the input exceeds the input lower limit value of the output buffer 208, the output of the output buffer 208 oscillates between the output VOH and the output VOL at the frequency that corresponds to the output frequency, even in the case of an abnormal product. The levels of the output VOH and the output VOL are substantially constant as long as the amplitude of the input exceeds the input lower limit value of the output buffer 208 even in the case of an abnormal product. Therefore, based on the output from the output buffer 208, it is not possible to directly read the abnormality of the oscillation circuit (for example, the abnormality of the crystal oscillator 100). Therefore, the failure of the oscillation circuit including the crystal oscillator 100 is often recognized only when its output falls below the standard (for example, the frequency standard lower limit value) or when the output stops. It is noted that there may be often the case that the main cause of failure of the oscillation circuit resulted from the crystal oscillator 100 included therein.

As described above, the abnormality of the crystal oscillator 100 is often known only after the crystal oscillator 100 has stopped outputting. This means that the repair/replacement timing of the crystal oscillator 100 suddenly comes in, which is significantly inconvenient for a user of a system using an output from the oscillation circuit including the crystal oscillator 100 as a clock source. Especially, when the crystal oscillator 100 is used in a system that requires high reliability, the adverse effect when the system suddenly goes down may be significant. In addition, when the crystal oscillator 100 is used in a relay station device or the like installed in a remote mountainous area or the like, it may take time to repair or exchange it, which may increase the down time of the system. Although such a disadvantage can be avoided to some extent by providing a redundant system, providing a redundant system adds cost.

In this regard, according to the first embodiment, as described above, the alarm issuing circuit 250 generates the alarm when the amplitude of the sub vibration signal becomes equal to or less than the reference value β. As described above, the reference value β, is set to a value greater than the amplitude Em of the sub vibration signal when the amplitude of the input to the output buffer 208 becomes the input lower limit value. Therefore, according to the first embodiment, the alarm can be generated by the alarm issuing circuit 250 before the amplitude of the signal appearing at the point B in the oscillation circuit illustrated in FIG. 3 falls below the input lower limit value of the output buffer 208. As a result, it is possible to notify the user of the system using the output from the oscillation circuit including the crystal oscillator 100 as the clock source in advance the necessity of repair/replacement due to the alarm. That is, before the crystal oscillator 100 stops outputting, the user can be notified of necessity of repair/replacement by the alarm in advance. As a result, it is possible to avoid situations where the system suddenly goes down if the user, who is notified of necessity of repair/replacement by the alarm in advance, plans appropriate repair/replacement work.

In addition, according to the first embodiment, as described above, the gain control circuit 260 increases the gain of the inverting amplifier 206 in synchronization with the occurrence of the alarm. When the gain of the inverting amplifier 206 is increased, the amplitude of the output from the inverting amplifier 206 (the amplitude of the input to the output buffer 208) increases. Therefore, according to the first embodiment, the amplitude of the input to the output buffer 208 can be increased in synchronization with the occurrence of the alarm, and as a result, the period until the crystal oscillator 100 stops outputting can be extended. That is, according to the first embodiment, even in the case of an abnormal product, the period until the crystal oscillator 100 stops outputting can be extended in response to the occurrence of the alarm. As a result, it becomes easier for the user to secure the necessary time for executing appropriate repair/replacement work. This effect is particularly useful when the crystal oscillator 100 is used for a relay station apparatus or the like installed in a remote mountainous area or the like. This is because, in such a case, it takes time for repair and exchange work in many cases.

Further, in the first embodiment described above, since the output of the crystal oscillator 100 in the oscillating state can be indirectly monitored via the sub vibration electrodes 70, a monitoring system independent of the oscillation circuit can be formed. Therefore, according to the first embodiment, it is possible to monitor the output of the crystal oscillator 100 in the oscillating state in a manner that does not affect the oscillation circuit.

Figure 8:
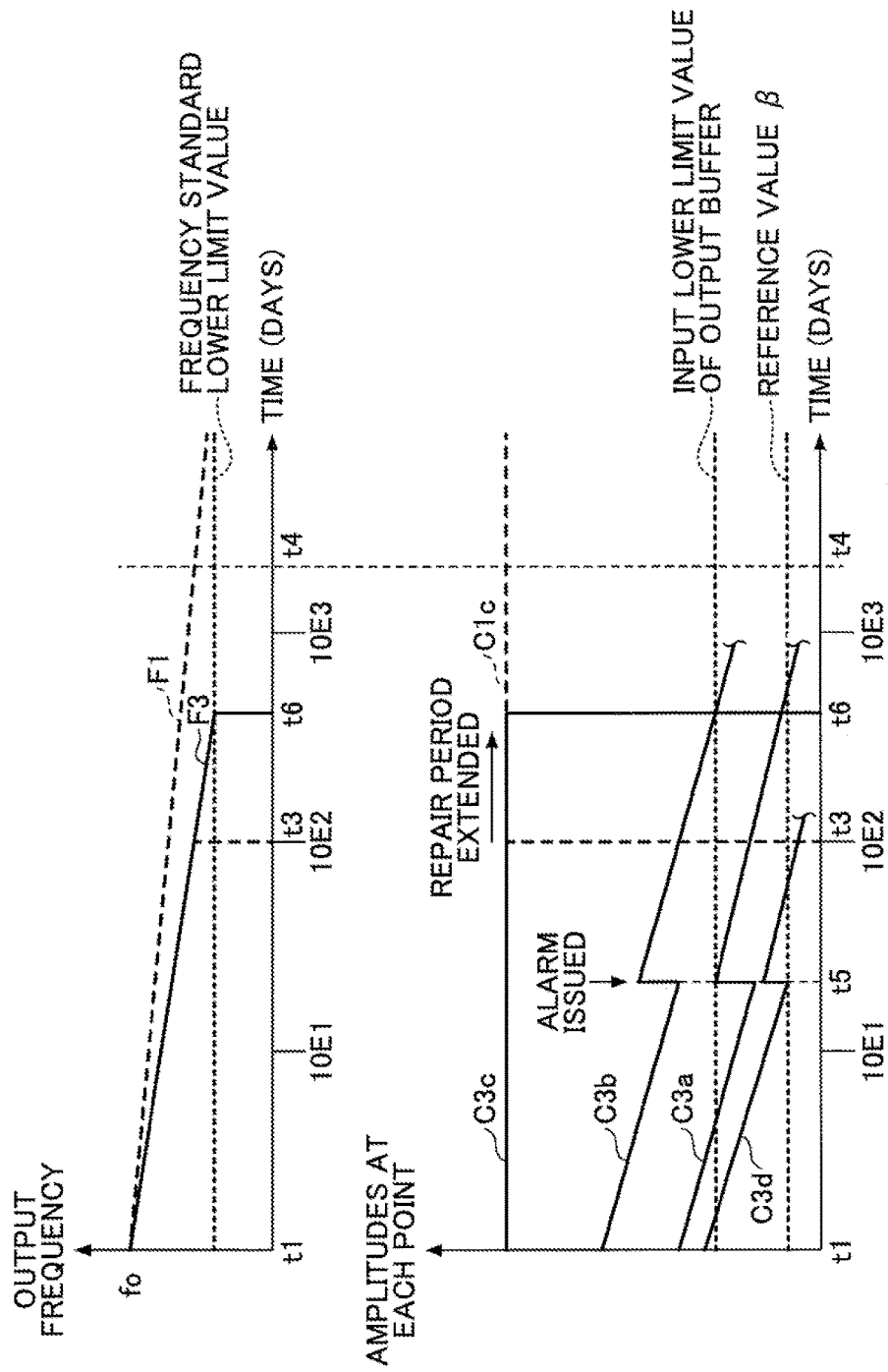
FIG. 8 is a diagram explaining an example of an operation according to the first embodiment.

FIG. 8 is a diagram explaining an example of an operation according to the first embodiment. In FIG. 8, t1 represents a time point at which the crystal oscillator 100 starts to operate, t5 represents a detection time of the pre-output stop state, t6 represents a time point when the crystal oscillator 100 stops outputting, and t4 represents the point of design life. Further, in FIG. 8, the output stop time t3 in the case of FIG. 6 is illustrated for comparison. FIG. 8 illustrates a case where the crystal oscillator 100 is not repaired or replaced until the crystal oscillator 100 stops outputting.

FIG. 8 illustrates, as in the case of FIG. 6 described above, on the upper side, a frequency characteristic diagram illustrating the time-varying characteristics of the output frequency of the crystal oscillator 100, taking the time on the horizontal axis and the output frequency of the crystal oscillator 100 on the vertical axis. In the frequency characteristic diagram, the frequency standard lower limit value with respect to the output frequency of the crystal oscillator 100 is illustrated, and the time variation characteristic F1 (dotted line) related to a normal product and the time variation characteristic F3 (solid line) related to an abnormal product that stops outputting before the design life are illustrated. The abnormal product in FIG. 8 is assumed to be the same as the abnormal product in FIG. 6.

FIG. 8 illustrates, similar to FIG. 6, on the lower side, an output change characteristic diagram indicating the time-varying characteristics C3a, C3b, C3c, C3d (i.e., the time-varying characteristics related to an abnormal product), taking the time on the horizontal axis and the amplitude. Time-varying characteristics C3d is the time-varying characteristics of the amplitude of the signal appearing in the sub vibration electrodes 70 (the same characteristics according to an abnormal product). In the output change characteristic diagram, the input lower limit value of the output buffer 208, the reference value β, and the time variation characteristic C1c (dotted line) related to a normal product are also illustrated.

In the case of an abnormal product, similar to FIG. 6, the output frequency of the crystal oscillator 100 is significantly higher than the decrease speed due to aging in a normal product, as illustrated in the time variation characteristic F3 on the upper side of FIG. 8. However, in the first embodiment, as described above, unlike FIG. 6, the gain control circuit 260 functions to prevent the entire system from stopping outputting and thus being down at time t3. That is, even in the case of an abnormal product, as illustrated in the time varying characteristic F3 at the top of FIG. 8, until time t6 after time t3, it is possible to delay the timing at which the entire system is down. It is noted that, in the example illustrated in FIG. 8, a timing when the output frequency of the crystal oscillator 100 falls below the frequency standard lower limit value is the same as a timing when the entire system is down (i.e., the timing at which the level of the signal appearing at point C becomes the constant value 0); however, this is not indispensable. However, preferably, the timing, at which the output frequency of the crystal oscillator 100 falls below the frequency standard lower limit value, does not arrive before the timing at which the entire system is down.

Further, in the case of an abnormal product, the amplitude of the signal appearing at the point A in the oscillation circuit illustrated in FIG. 3 decreases by a significantly greater amount than the decrease due to aging in the case of a normal product, as illustrated in the time variation characteristic C3a on the lower side in FIG. 8. Thus, in the case of an abnormal product, the amplitude of the signal appearing at the point B in the oscillation circuit illustrated in FIG. 3 decreases by a significantly greater amount than the decrease due to aging in the case of a normal product, as illustrated in the time variation characteristic C3b on the lower side in FIG. 8. Thus, in the case of an abnormal product, similar to FIG. 6, before the design life, the amplitude of the signal appearing at the point B illustrated in FIG. 3 may fall below the input lower limit value of the output buffer 208.

In this regard, according to the first embodiment, as schematically illustrated by an arrow at the bottom of FIG. 8, the alarm is generated at time t5 at which the amplitude of the signal appearing in the sub vibration electrodes 70 is equal to or less than a reference value β. Accordingly, the gain of the inverting amplifier 206 is increased, and, as illustrated in the time varying characteristic C3b at the lower side of FIG. 8, the amplitude (i.e., the amplitude of the input to the output buffer 208) of the signal appearing at point B in the oscillation circuit illustrated in FIG. 3 increases. It is noted that, accordingly, the oscillation level of the crystal oscillator 100 is increased, the amplitude of the signal appearing at point A in the oscillation circuit illustrated in FIG. 3 increases, as illustrated in the time varying characteristic C3a at the lower side of FIG. 8. Thus, at time t5, the amplitude of the signal appearing at point B in the oscillation circuit illustrated in FIG. 3 increases. However, because of an abnormal product, even at time t5, the amplitude of the signal appearing at point B in the oscillation circuit illustrated in FIG. 3 continues to decrease by the decrease amount significantly greater than the decrease amount due to the aging of a normal product. Then, before the design life, the amplitude of the signal appearing at the point B illustrated in FIG. 3 may fall below the input lower limit value of the output buffer 208. In the case of an abnormal product illustrated in FIG. 8, the amplitude of the signal appearing at the point B in the oscillation circuit illustrated in FIG. 3 falls below the input lower limit value of the output buffer 208 at the time t6, as illustrated in the time variation characteristic C3b on the lower side of FIG. 8. In this way, in the case of an abnormal product illustrated in FIG. 8, the amplitude of the signal appearing at the point B in the oscillation circuit illustrated in FIG. 3, that is, the amplitude of the input to the output buffer 208 falls below the input lower limit value before the design life, and thus the crystal oscillator 100 transitions to the output stop state. However, in the first embodiment, as can be seen in comparison with FIG. 6, a timing t6 when the crystal oscillator 100 transitions to the output stop state, comes later than the timing t3 in FIG. 6. That is, in the first embodiment, even in the case of an abnormal product, as compared with the comparative example, the timing when the crystal oscillator 100 transitions to the output stop state can be delayed. In other words, in the first embodiment, as compared with the comparative example, the repair or replacement timing of the crystal oscillator 100 can be delayed by a period of time t3 to time t6. It is noted that, in the example illustrated in FIG. 8, if the repair or replacement of the crystal oscillator 100 is performed during the period from time t3 to time t6, it is possible to avoid a situation where the system ends up down suddenly at time t6.

It is noted that, in the first embodiment described above, the functions of the alarm issuing circuit 250, the gain control circuit 260, and the reference voltage generating unit 270 are implemented by the IC 200; however, at least a part of the functions may be realized by a computer. For example, the functions of the alarm issuing circuit 250 and the gain control circuit 260 may be implemented by a CPU of the computer executing a program, and the function of the reference voltage generating unit 270 may be implemented by a memory of the computer.

Figure 9:
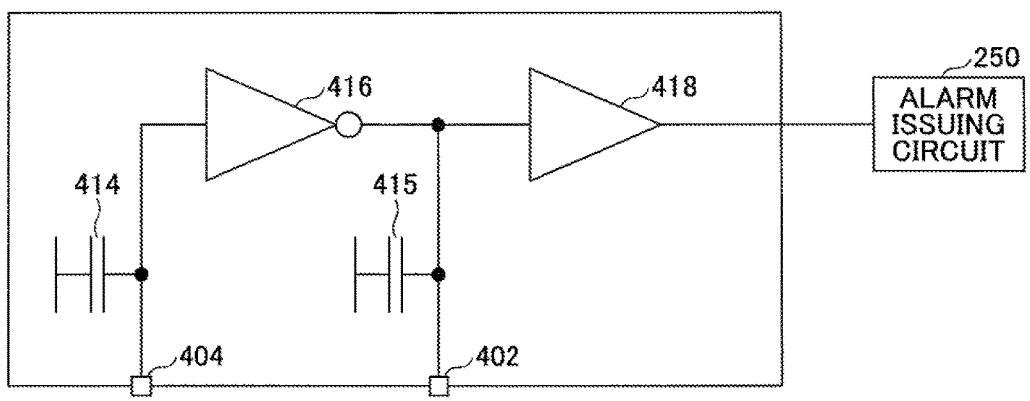
FIG. 9 is a diagram explaining a sub oscillation circuit for sub vibration.

Further, in the first embodiment described above, a sub vibration oscillator circuit 400 may be provided between the alarm issuing circuit 250 and sub vibration electrodes 70, as illustrated in FIG. 9. In the example illustrated in FIG. 9, the sub vibration oscillator circuit 400 includes matching capacitors 414 and 415, an inverting amplifier 416 and a monitor amplifier 418. The output terminal 402 of the sub vibration oscillator circuit 400 is electrically connected to the third sub electrode 73 and the fourth sub electrode 74. The input terminal 404 of the sub vibration oscillator circuit 400 is electrically connected to the first sub electrode 71 and the second sub electrode 72. In this case, the alarm issuing circuit 250 can monitor the level of the sub vibration through the output of the monitor amplifier 418.

Second Embodiment

A crystal oscillator device according to the second embodiment differs from the crystal oscillator device according to the first embodiment described above in that the crystal oscillator 100 is replaced with a crystal oscillator 100C. The crystal oscillator 100C according to the second embodiment differs from the crystal oscillator 100 according to the first embodiment described above in that the casing 30 and the sub vibration electrodes 70 are replaced with a casing 30C and sub vibration electrodes 70C, respectively. Further, in the second embodiment, the wiring for the sub vibration electrodes 70C is different from the wiring for the sub vibration electrodes 70 according to the first embodiment described above. Other elements of the crystal oscillator 100C according to the second embodiment may be the same as those of the crystal oscillator 100 according to the first embodiment described above, and explanation thereof is omitted. It is noted that, in the second embodiment, the function of IC 200 is substantially the same as that of the first embodiment described above.

Figure 10:
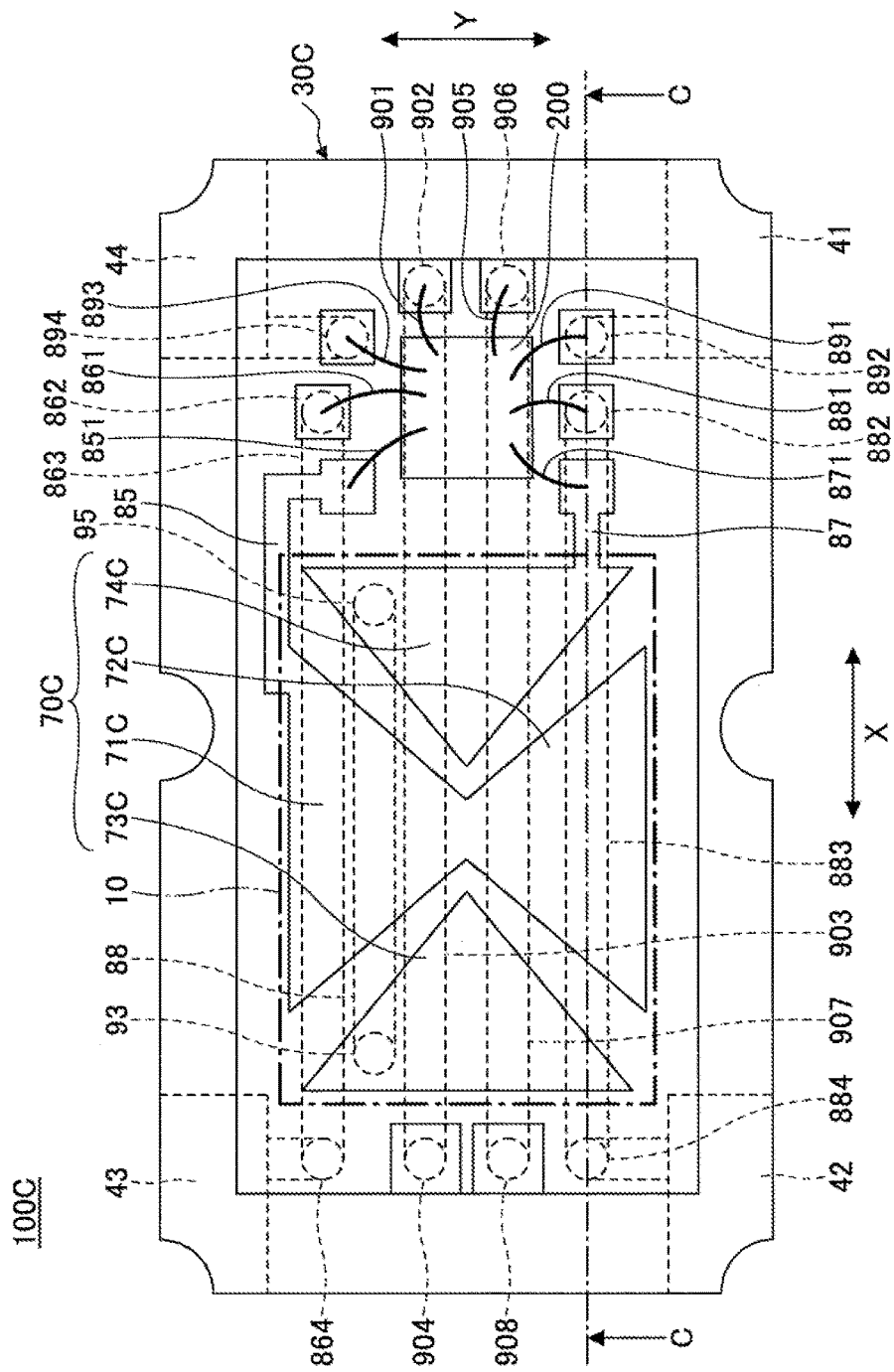
FIG. 10 is a top view schematically illustrating a configuration of a crystal oscillator according to a second embodiment.
Figure 11:
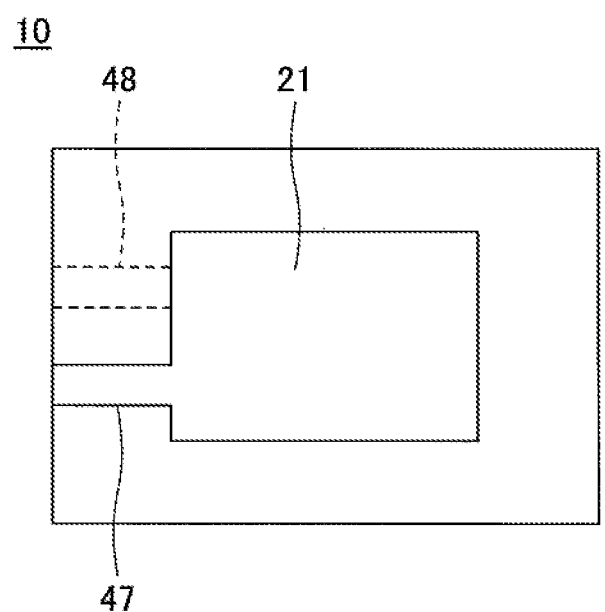
FIG. 11 is a top view illustrating a crystal piece and excitation electrodes.
Figure 12:
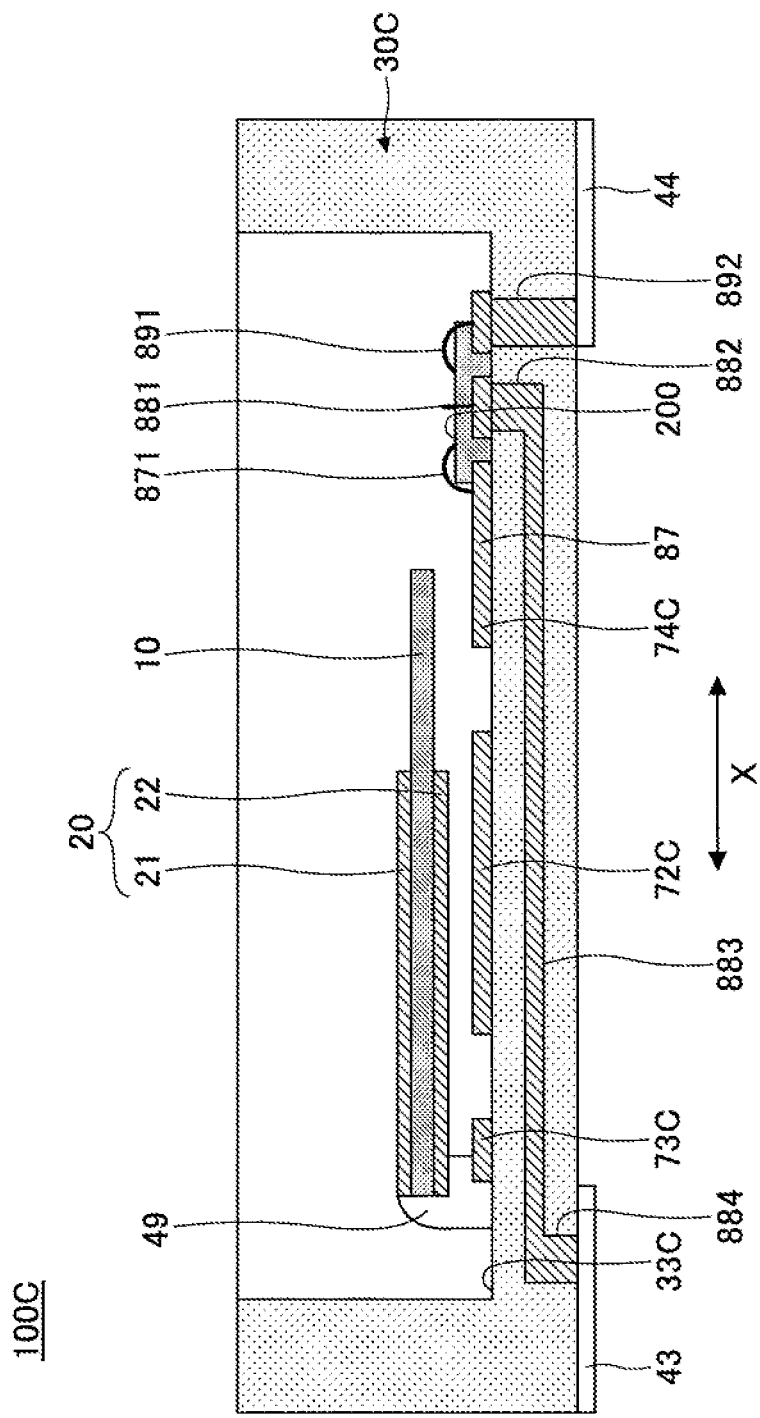
FIG. 12 is a cross-sectional view of a crystal oscillator.

FIG. 10 is a top view schematically illustrating a configuration of the crystal oscillator 100C according to the second embodiment. In FIG. 10, a lid of the casing 30C is not illustrated so that the inside is visible. Further, in FIG. 10, the crystal piece 10 and the excitation electrodes 20 are illustrated with only the outlines thereof by a dashed line such that as the lower part of the casing 30C becomes visible. FIG. 11 is a top view of the crystal piece 10 and the excitation electrodes 20. FIG. 12 is a cross-sectional view of the crystal oscillator 100C, taken along line C-C in FIG. 10.

The crystal oscillator 100C includes a crystal piece 10, excitation electrodes 20, a casing 30C, external electrodes 41 to 44, and sub vibration electrodes 70C. The crystal unit 100C, as illustrated in FIG. 10, is of a surface mount type.

The casing 30C differs from the casing 30 according to the first embodiment described above in that the bank portion 31 is not provided. However, the casing 30C may have a bank portion 31, like the casing 30 according to the first embodiment described above. The crystal piece 10 may be cantilevered by the casing 30C. In the example illustrated in FIG. 10, the casing 30C supports one end of the crystal piece 10 in X direction on the electrically conductive adhesive 49.

The sub vibration electrodes 70C include first to fourth sub electrodes 71C to 74C. The first to fourth sub electrodes 71C to 74C are provided on the casing 30C. The first to fourth sub electrodes 71C to 74C are formed at positions such that the first to fourth sub electrodes 71C to 74C are capable of picking up the electric field change caused by the sub vibration of the crystal piece 10 (see FIG. 2).

In the example illustrated in FIGS. 10 to 12, the first to fourth sub electrodes 71C to 74C are formed as follows. The first to fourth sub electrodes 71C to 74C are provided on the bottom surface 33C of the casing 30C (i.e., the inner surface of the lower part of the casing 30C). The first to fourth sub electrodes 71C to 74C are opposed to the crystal piece 10 in the vertical direction. That is, the first to fourth sub electrodes 71C to 74C are overlapped with the crystal piece 10 in a top view. It is noted that, in the example illustrated in FIGS. 10 to 12, the first to fourth sub electrodes 71C to 74C are completely overlapped with the crystal piece 10 in the top view; however, the first to fourth sub electrodes 71C to 74C may be partially overlapped with the crystal piece 10 in the top view. The first sub electrode 71C and the second sub electrode 72C are disposed so as to sandwich the upper excitation electrode 21 in Y direction in the top view. That is, the first sub electrode 71C and the second sub electrode 72C are overlapped with the opposite ends (see a first region 11 and a second region 12 in FIG. 13) of the crystal piece 10 in Y direction in the top view, respectively. The third sub electrode 73C and the fourth sub electrode 74C are arranged such that the third sub electrode 73C and the fourth sub electrode 74C sandwich the upper excitation electrode 21 in X direction. That is, the third sub electrode 73C and the fourth sub electrode 74C are overlapped with the opposite ends (see a third region 13 and a fourth region 14 in FIG. 13) of the crystal piece 10 in X direction in the top view, respectively.

Further, in the example illustrated in FIGS. 10 to 12, the first to fourth sub electrodes 71C to 74C are arranged in point symmetry with respect to the center of the rectangular crystal piece 10 in the top view. That is, in the top view, the first sub electrode 71C and the second sub electrode 72C are disposed at the center of the crystal piece 10 in X direction, and the third sub electrode 73C and the fourth sub electrode 74C are disposed at the center of the crystal piece 10 in Y direction. However, the first to fourth sub electrodes 71C to 74C may be arranged offset to one side from the center of each side of the rectangular crystal piece 10 in the top view. Further, in the example illustrated in FIGS. 10 to 12, the first to fourth sub electrodes 71C to 74C are in a triangular shape; however, the first to fourth sub electrodes 71C to 74C may be in a form of a rectangle or the like.

The first to fourth sub electrodes 71C to 74C are electrically connected to the IC 200, like the first to fourth sub electrodes 71 to 74 according to the first embodiment described above. The way for the electrical connection is arbitrary.

In the example illustrated in FIGS. 10 to 12, the first to fourth sub electrodes 71C to 74C are electrically connected to the IC 200 as follows. The first sub electrode 71C is electrically connected to IC 200 via a conductor pattern 85 formed on the bottom surface 33C of the casing 30C and the wire 851. It is noted that the wire 851 (and also other wires such as a wire 871 described hereinafter) may be formed by wire bonding. The second sub electrode 72C is electrically connected to the first sub electrode 71C. Accordingly, the first sub electrode 71C and the second sub electrode 72C are electrically connected to the IC 200. The third sub electrode 73C is electrically connected to the fourth sub electrode 74C through conductor patterns 88 formed in the inner layer of the casing 30C and vias 93 and 95. The fourth sub electrode 74C is electrically connected to the IC 200 via a conductor pattern 87 formed on the bottom surface 33C of the casing 30C and a wire 871. Accordingly, the fourth sub electrode 74C and the third sub electrode 73C are electrically connected to the IC 200.

It is noted that, in the example illustrated in FIGS. 10 to 12, the IC 200 and the external electrodes 41 are electrically connected via a wire 891, the via 892, etc. Further, the IC 200 and the external electrode 42 are electrically connected via the wire 881, the via 882, the conductive pattern 883 formed on the inner layer of the casing 30C, the via 884, etc. Further, the IC 200 and the external electrode 43 are electrically connected via the wire 861, the via 862, the conductive pattern 863 formed on the inner layer of the casing 30C, the via 864, etc. Further, the IC 200 and the external electrodes 44 are electrically connected via the wire 893, the via 894, etc.

Further, in the example illustrated in FIGS. 10 to 12, the IC 200 and the upper excitation electrode 21 are electrically connected via the wire 905, the via 906, the conductive pattern 907 formed on the inner layer of the casing 30C, the via 908, the electrically conductive adhesive (not illustrated), the conductive pattern 47, etc. Further, the IC 200 and the lower external electrode 22 are electrically connected via the wire 901, the via 902, the conductive pattern 903 formed on the inner layer of the casing 30C, the via 904, the electrically conductive adhesive (not illustrated), the conductive pattern 48, etc.

Figure 13:
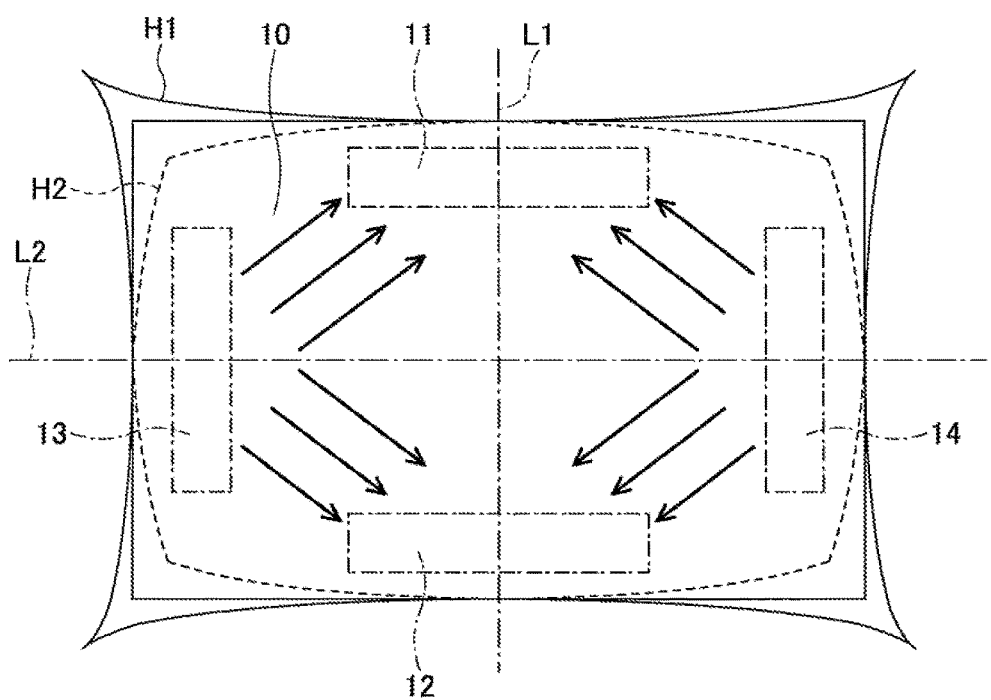
FIG. 13 is an explanatory diagram of a detection principle of an electric field change by sub vibration electrodes.

FIG. 13 is an explanatory view of the principle of detecting the change in the electric field with the sub vibration electrodes 70, and is a diagram schematically illustrating only the crystal piece 10 in the top view. In FIGS. 13, H1 and H2 schematically represent a change in the outer shape (contour) of the crystal piece 10 caused by the displacement due to the sub vibration. Further, in FIG. 13, the regions 11 to 14 of the crystal piece 10 that are opposed to the first to fourth sub electrodes 71C to 74C (i.e., the regions 11 to 14 which are opposed to the first to fourth sub electrodes 71C to 74C in the vertical direction) are illustrated by a dashed line. Further, in FIG. 13, the arrows between the regions 11 to 14 represent the direction of the electric field generated between the regions 11 to 14 in the crystal oscillator 100C at the timing. It is noted that FIG. 13 is a schematic view, and thus positions of the regions 11 to 14 do not correspond exactly to those illustrated in FIGS. 10 to 12.

In the crystal oscillator 100C of the oscillation state, between the first region 11 and third region 13 of the crystal piece 10, between the first region 11 and fourth region 14, between the second region 12 and third region 13, and, between the second region 12 and the fourth region 14, the alternating electric field is generated. The electric field arrows illustrated in FIG. 13 indicate the direction of the electric field. Such an alternating electric field also occurs in adjacent space. That is, the electric field also extends to the first to fourth sub electrodes 71C to 74C that are close to the crystal piece 10. Thus, a similar alternating electric field is also generated between the first sub electrode 71C and the third sub electrode 73C, between the first sub electrode 71C and the fourth sub electrode 74C, between the second sub electrode 72C and the third sub electrode 73C, and between the second sub electrode 72C and the fourth sub electrode 74C. It is noted that the arrows of the electric field illustrated in FIG. 13 represent the direction of the electric field at the time when the crystal piece 10 is displaced in such a manner as illustrated in the outline H1. In this case, the direction of the electric field is from the third sub electrode 73C and the fourth sub electrode 74C to the first sub electrode 71C and the second sub electrode 72C. In this state, the first sub electrode 71C and the second sub electrode 72C become low potential with respect to the third sub electrode 73C and the fourth sub electrode 74C. It is noted that the direction of the main field is inclined with respect to X direction (direction of the main vibration), as illustrated in FIG. 13. In other words, the direction of the main field is from the center of each side toward the center of the adjacent sides. When the crystal piece 10 is displaced in the manner illustrated by the outline H2, an electric field in the direction opposite to the electric field direction illustrated in FIG. 13 is generated. In this state, the first sub electrode 71C and the second sub electrode 72C become high potential with respect to the third sub electrode 73C and the fourth sub electrode 74C. In this way, it is possible to generate the alternating electric field between the first to fourth sub electrodes 71C to 74C.

Also, according to the second embodiment, the same effects as in the first embodiment can be obtained. That is, the output of the crystal oscillator 100C in the oscillating state can be monitored via the sub vibration electrodes 70C, and thus the pre-output stop state of the crystal oscillator 100C can be detected as well. And, at the time of detection of the pre-output stop state, the alarm can be issued, and the period up to the timing of the output stoppage of the crystal oscillator 100C can be extended by increasing the gain of the inverting amplifier 206. Further, according to the second embodiment, since the output of the crystal oscillator 100C in the oscillating state can be indirectly monitored via the sub vibration electrodes 70C, a monitoring system independent of the oscillation circuit can be formed. Therefore, according to the second embodiment, it is possible to monitor the output of the crystal oscillator 100C in the oscillating state in a manner that does not affect the oscillation circuit.

Further, according to the second embodiment, the electrical connection between the sub vibration electrodes 70C (the first to fourth sub electrodes 71C to 74C) and the IC 200 becomes easier because the sub vibration electrodes 70C are provided on the casing 30C. For example, in the case where the sub vibration electrodes 70 are provided on the crystal piece 10 as in the first embodiment described above, the electrical connection can be realized by wire bonding; however, such an electrical connection method causes complication of the wiring. Moreover, in the case where the sub vibration electrodes 70 are provided on the crystal piece 10 as in the first embodiment described above, the electrical connection can be realized by using an electrically conductive adhesive in the same manner as the excitation electrodes 20 on the crystal piece 10; however, such an electrical connection method may affect the oscillation characteristics of the crystal piece 10 because of the increased supporting points. For example, a size of the crystal piece 10 is required in order to achieve the desired oscillation characteristics. In this respect, according to the crystal oscillator 100C according to the second embodiment, since the sub vibration electrodes 70C are provided in the casing 30C, such an inconvenience can be suppressed. Further, the conductor patterns 85, 87, 88, etc., related to the sub vibration electrodes 70C can be formed in the same process for forming the conductor patterns 903, 907, etc., related to the excitation electrodes 20, which can improve productivity.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention. Further, all or part of the components of the embodiments described above can be combined.

For example, in the first embodiment (the same applies to the second embodiment) described above, the sub vibration is a contour vibration of a particular form as illustrated in FIG. 2 (a form near the center on each side becomes a node); however, the contour vibration may be in other forms.

Further, in the second embodiment described above, the sub vibration electrodes 70C are provided on the bottom surface 33C of the casing 30C; however, the sub vibration electrodes 70C may be provided on other portions of the casing 30 (the lid 34, for example).

What is claimed is:

1. A crystal oscillator device, comprising:
    a crystal oscillator including a casing, a crystal piece, a pair of excitation electrodes configured to excite a main vibration, and a pair of sub vibration electrodes configured to excite a sub-vibration; and
    an alarm generator configured to generate an alarm based on a signal whose amplitude is equal to or less than a reference value, the signal being generated in the sub vibration electrodes.

2. The crystal oscillator device of claim 1, wherein the reference value is greater than the amplitude that is obtained when an output of the crystal oscillator stops outputting.

3. The crystal oscillator device of claim 1, further comprising:
    an inverting amplifier electrically connected between the pair of excitation electrodes; and
    a gain control unit configured to increase a gain of the inverting amplifier when the amplitude becomes equal to or less than the reference value.

4. The crystal oscillator device of claim 3, wherein the inverting amplifier includes an operational amplifier, a first resistor, and a second resistor, the second resistor having a resistance value larger than that of the first resistor;
    the gain control unit switches from a first state, in which an inverting terminal of the operational amplifier is electrically connected to an output terminal of the operational amplifier via the first resistor, to a second state, in which the inverting terminal is electrically connected to the output terminal via the second resistor, to increase the gain.

5. The crystal oscillator device of claim 3, wherein the inverting amplifier, the alarm generator, and the gain control unit are provided in the casing.

6. The crystal oscillator device of claim 1, wherein the sub vibration electrodes are formed on the crystal piece.

7. The crystal oscillator device of claim 1, wherein the sub vibration electrodes are formed on the casing.

8. The crystal oscillator device of claim 7, wherein the sub vibration electrodes includes first to fourth sub vibration electrodes, the first sub vibration electrode being opposed to a first region of the crystal piece in a thickness direction of the crystal piece, the second sub vibration electrode being opposed to a second region of the crystal piece in the thickness direction of the crystal piece, the third sub vibration electrode being opposed to a third region of the crystal piece in the thickness direction of the crystal piece, and the fourth sub vibration electrode being opposed to a fourth region of the crystal piece in the thickness direction of the crystal piece,
    the first and second regions are on opposite sides of the crystal piece in a direction perpendicular to a main vibration direction and with respect to a center of the crystal piece, and the third and fourth regions are on opposite sides of the crystal piece in the main vibration direction and with respect to a center of the crystal piece.

9. The crystal oscillator device of claim 1, wherein the main vibration is a thickness shear vibration, and the sub vibration is a contour vibration.

10. The crystal oscillator device of claim 3, further comprising an output buffer provided on an output side of the inverting amplifier, the output buffer having a lower limit value for an input thereto, wherein
    the reference value is greater than the amplitude obtained when an output of the inverting amplifier corresponds to the lower limit value.

11. A method of measuring a characteristic of a crystal oscillator, the method comprising:
    monitoring an amplitude of a signal appearing in a pair of sub vibration electrodes of the crystal oscillator where a change in an electric field is generated due to a sub vibration of the crystal oscillator in an oscillating state; and
    causing an alarm generator to generate an alarm when the amplitude of the signal is equal to or lower than a reference value,
    the reference value is greater than the amplitude that is obtained when an output of the crystal oscillator stops outputting.

* * * * *